(12) United States Patent
Zhou et al.

(10) Patent No.: US 10,786,976 B2
(45) Date of Patent: Sep. 29, 2020

(54) WATER/OIL REPELLENT LAYER-PROVIDED ARTICLE AND METHOD FOR PRODUCING IT

(71) Applicant: AGC Inc., Tokyo (JP)

(72) Inventors: Lilin Zhou, Tokyo (JP); Kumiko Suwa, Tokyo (JP); Kenji Ishizeki, Tokyo (JP); Hideyuki Hirakoso, Tokyo (JP); Daisuke Kobayashi, Tokyo (JP); Michinori Suehara, Tokyo (JP); Mio Tokunaga, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 16/364,491

(22) Filed: Mar. 26, 2019

(65) Prior Publication Data

US 2019/0217580 A1 Jul. 18, 2019

Related U.S. Application Data

(63) Continuation of application No. PCT/JP2018/023150, filed on Jun. 18, 2018.

(30) Foreign Application Priority Data

Jun. 21, 2017 (JP) .................................. 2017-121642
Jan. 15, 2018 (JP) .................................. 2018-004491

(51) Int. Cl.
*B32B 17/10* (2006.01)
*B32B 27/28* (2006.01)
(Continued)

(52) U.S. Cl.
CPC ........ *B32B 17/10715* (2013.01); *B05D 5/083* (2013.01); *B32B 9/00* (2013.01);
(Continued)

(58) Field of Classification Search
None
See application file for complete search history.

(56) References Cited

U.S. PATENT DOCUMENTS

2011/0315200 A1   12/2011   Asuka
2015/0315443 A1*  11/2015   Takeda .................... C03C 17/30
                                                    428/429

FOREIGN PATENT DOCUMENTS

JP        10-146927       6/1998
JP        2005324139 A  * 11/2005
(Continued)

OTHER PUBLICATIONS

English machine translation of 2005324139 (2005).*
(Continued)

*Primary Examiner* — Kenneth J Stachel
(74) *Attorney, Agent, or Firm* — Oblon, McClelland, Maier & Neustadt, L.L.P.

(57) ABSTRACT

A water/oil repellent layer-provided article, containing a substrate, a water/oil repellent layer containing a hydrolyzed condensate of a fluorinated compound having a hydrolyzable silyl group, and a silicon oxide layer containing alkali metal atoms, present between the substrate and the water/oil repellent layer, where in the silicon oxide layer, the average concentration of the alkali metal atoms in a region with a depth from the surface in contact with the water/oil repellent layer of at least 0.1 nm and at most 0.3 nm, is at least $2.0 \times 10^{19}$ atoms/cm$^3$.

11 Claims, 2 Drawing Sheets

(51) Int. Cl.
*C08L 71/02* (2006.01)
*C08K 5/5419* (2006.01)
*B32B 9/00* (2006.01)
*G06F 3/00* (2006.01)
*B05D 5/08* (2006.01)
*C03C 17/42* (2006.01)
*C23C 16/40* (2006.01)

(52) U.S. Cl.
CPC ............ *B32B 27/285* (2013.01); *C03C 17/42* (2013.01); *C08K 5/5419* (2013.01); *C08L 71/02* (2013.01); *G06F 3/00* (2013.01); *B05D 2201/00* (2013.01); *B05D 2203/35* (2013.01); *B05D 2350/63* (2013.01); *B32B 2307/7265* (2013.01); *B32B 2307/73* (2013.01); *C03C 2217/76* (2013.01); *C23C 16/401* (2013.01)

(56) References Cited

FOREIGN PATENT DOCUMENTS

| | | |
|---|---|---|
| JP | 2012-72272 | 4/2012 |
| JP | 2014-218639 | 11/2014 |
| JP | 2016-033109 | 3/2016 |
| WO | WO 2010/104069 | 9/2010 |
| WO | WO 2014/126064 | 8/2014 |

OTHER PUBLICATIONS

U.S. Appl. No. 14/878,054, filed Jan. 28, 2016, US 2016/0025899, Kenji Ishizeki et al.
International Search Report dated Sep. 11, 2018, in PCT/JP2018/023150 filed Jun. 18, 2018.

* cited by examiner

WATER/OIL REPELLENT LAYER-PROVIDED ARTICLE AND METHOD FOR PRODUCING IT

TECHNICAL FIELD

The present invention relates to a water/oil repellent layer-provided article, and a method for producing it.

BACKGROUND ART

In order to impart to the surface of a substrate water/oil repellency, fingerprint stain removability, lubricity (smoothness when touched with a finger), etc., it has been known to form a water/oil repellent layer comprising a hydrolyzed condensate of a fluorinated compound on the surface of the substrate by surface treatment using a fluorinated compound having a poly(oxyperfluoroalkylene) chain and a hydrolyzable silyl group.

Further, since the water/oil repellent layer is required to have abrasion resistance, in order to improve adhesion between the substrate and the water/oil repellent layer, an undercoat layer is formed between them. For example, between the substrate and the water/oil repellent layer, a silicon oxide layer is formed by deposition (Patent Documents 1 and 2), or between the substrate and the water/oil repellent layer, an undercoat layer comprising a hydrolyzed condensate such as $Si(NCO)_4$ is formed (Patent Document 3).

PRIOR ART DOCUMENTS

Patent Documents

Patent Document 1: JP-A-2014-218639
Patent Document 2: JP-A-2012-72272
Patent Document 3: WO2014/126064

DISCLOSURE OF INVENTION

Technical Problem

By the silicon oxide layer or the undercoat layer as disclosed in each of Patent Documents 1 to 3, adhesion between the substrate and the water/oil repellent layer may be insufficient. A water/oil repellent layer is required to have more improved abrasion resistance, and accordingly, more improved adhesion between the substrate and the water/oil repellent layer is also required.

The object of the present invention is to provide a water/oil repellent layer-provided article of which the water/oil repellent layer is excellent in abrasion resistance, and a method for producing it.

Solution to Problem

The present invention provides a water/oil repellent layer-provided article and a method for producing it, having the following constitutions [1] to [17].

[1] A water/oil repellent layer-provided article, comprising:
a substrate,
a water/oil repellent layer comprising a hydrolyzed condensate of a fluorinated compound having a hydrolyzable silyl group, and
a silicon oxide layer containing alkali metal atoms, present between the substrate and the water/oil repellent layer,
wherein in the silicon oxide layer, the average concentration of the alkali metal atoms in a region with a depth from the surface in contact with the water/oil repellent layer of from 0.1 to 0.3 nm, is at least $2.0 \times 10^{19}$ atoms/$cm^3$.

[2] The article according to [1], wherein the average concentration of the alkali metal atoms is at most $4.0 \times 10^{22}$ atoms/$cm^3$.

[3] The article according to [1] or [2], wherein at least part of the alkali metal atoms are sodium atoms.

[4] The article according to any one of [1] to [3], wherein silicon oxide in the silicon oxide layer comprises a condensate of silicic acid or a hydrolyzed condensate of an alkoxysilane.

[5] The article according to any one of [1] to [4], wherein silicon oxide in the silicon oxide layer comprises a deposit of silicon oxide containing the alkali metal atoms.

[6] The article according to any one of [1] to [5], wherein the fluorinated compound is a compound having a hydrolyzable silyl group and a poly(oxyperfluoroalkylene) chain.

[7] A method for producing a water/oil repellent layer-provided article, comprising:
forming a silicon oxide layer containing alkali metal atoms on the surface of a substrate using a silicon oxide-forming material containing a silicon oxide precursor and an alkali metal source, and
forming, on the surface of the silicon oxide layer, a water/oil repellent layer comprising a hydrolyzed condensate of a fluorinated compound having a hydrolyzable silyl group,
wherein the silicon oxide layer is a silicon oxide layer in which the average concentration of the alkali metal atoms in a region with a depth from the surface in contact with the water/oil repellent layer of from 0.1 to 0.3 nm is at least $2.0 \times 10^{19}$ atoms/$cm^3$.

[8] The production method according to [7], wherein the silicon oxide layer is formed on the substrate surface using a coating fluid containing at least one silicon oxide precursor selected from the group consisting of silicic acid, a partial condensate of silicic acid, a tetraalkoxysilane and its partial condensate, an alkali metal source and a solvent.

[9] The production method according to [7], wherein the silicon oxide layer is formed on the substrate surface using silicon oxide containing the alkali metal atoms.

[10] The production method according to [9], wherein the content of the alkali metal atoms in the silicon oxide containing the alkali metal atoms is at least 200 ppm to silicon atoms.

[11] The production method according to [9] or [10], wherein the method of forming the silicon oxide layer is a deposition method.

[12] The production method according to any one of [7] to [11], wherein the average concentration of the alkali metal atoms in the above region is at most $4.0 \times 10^{22}$ atoms/$cm^3$.

[13] The production method according to any one of [7] to [12], wherein at least part of the alkali metal atoms are sodium atoms.

[14] The production method according to any one of [7] to [13], wherein the surface of the substrate is treated by corona discharge treatment, plasma treatment or plasma graft polymerization treatment, and then on the treated substrate surface, the silicon oxide layer is formed.

[15] A deposition source comprising silicon oxide containing alkali metal atoms.

[16] A silicon oxide layer-provided substrate, comprising a substrate and an alkali metal atom-containing silicon oxide layer formed on the surface of the substrate, the average concentration of the alkali metal atoms in a region with a depth from the exposed surface of the silicon oxide layer of from 0.1 to 0.3 nm being at least $2.0 \times 10^{19}$ atoms/cm$^3$, for forming a water/oil repellent layer on the exposed surface of the silicon oxide layer by using a fluorinated compound having a hydrolyzable silyl group.

[17] A fluorinated compound having a hydrolyzable silyl group, for forming a water/oil repellent layer on an exposed surface of a silicon oxide layer of a silicon oxide layer-provided substrate comprising a substrate and an alkali metal atom-containing silicon oxide layer formed on the surface of the substrate, the average concentration of the alkali metal atoms in a region with a depth from the exposed surface of the silicon oxide layer of from 0.1 to 0.3 nm being at least $2.0 \times 10^{19}$ atoms/cm$^3$.

Advantageous Effects of Invention

Of the water/oil repellent layer-provided article of the present invention, the water/oil repellent layer is excellent in abrasion resistance.

According to the method for producing a water/oil repellent layer-provided article of the present invention, a water/oil repellent layer-provided article of which the water/oil repellent layer is excellent in abrasion resistance can be produced.

DESCRIPTION OF EMBODIMENTS

In this specification, a compound represented by the formula (1) will be referred to as compound (1). The same applies to compounds represented by other formulae.

Meanings of the following terms in this specification are as follows.

An "alkali metal" means lithium (Li), sodium (Na), potassium (K), rubidium (Rb) and cesium (Cs).

A "hydrolyzable silyl group" means a group capable of forming a silanol group (Si—OH) when hydrolyzed. For example, it is —SiR$^{13}_{n1}$X$^1_{3-n1}$ in the formula (1).

An "etheric oxygen atom" means an oxygen atom forming an ether bond (—O—) between carbon atoms. The chemical formula of an oxyperfluoroalkylene group is represented such that the oxygen atom is on the right side of the perfluoroalkylene group.

[Water/Oil Repellent Layer-Provided Article]

The water/oil repellent layer-provided article of the present invention comprises a substrate, a water/oil repellent layer, and a silicon oxide layer containing alkali metal atoms, present between the substrate and the water/oil repellent layer.

Figure 1:
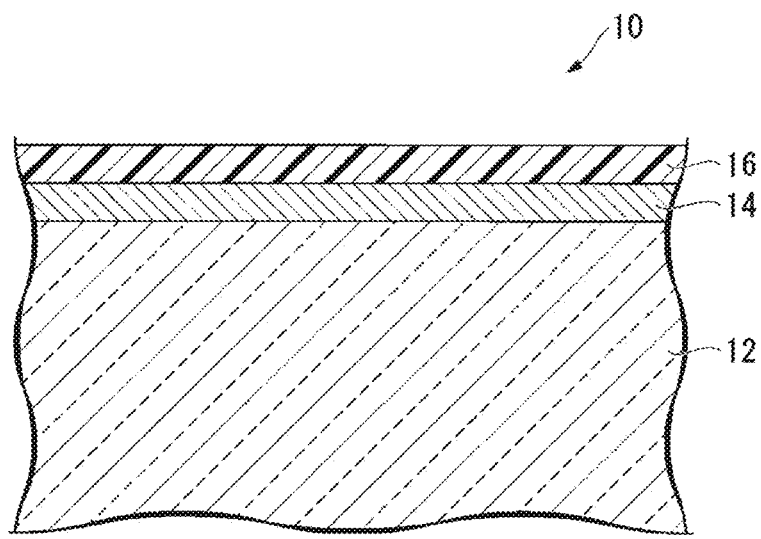
FIG. 1 is a cross sectional view illustrating an example of a water/oil repellent layer-provided article of the present invention.

FIG. 1 is a cross sectional view illustrating an example of a water/oil repellent layer-provided article of the present invention. The water/oil repellent layer-provided article 10 comprises a substrate 12, a silicon oxide layer 14 formed on the surface of the substrate 12 and a water/oil repellent layer 16 formed on the surface of the silicon oxide layer 14.

(Substrate)

The substrate in the present invention is not particularly limited so long as it is a substrate which is required to have water/oil repellency imparted. As a material of the substrate, a metal, a resin, glass, sapphire, a ceramic, a stone, or a composite material thereof may be mentioned. Glass may be chemically tempered.

As the substrate, a substrate for a touch panel or a substrate for a display is suitable, and a substrate for a touch panel is particularly suitable. The substrate for a touch panel has translucency. "Having translucency" means that the normal incidence visible light transmittance in accordance with JIS R3106: 1998 (ISO9050: 1990) being at least 25%. As a material of the substrate for a touch panel, glass or a transparent resin is preferred.

The substrate may have either one of or both surfaces treated by corona discharge treatment, plasma treatment or plasma graft polymerization treatment. Since the treated surface is more excellent in adhesion to the silicon oxide layer, whereby the water/oil repellent layer will be more excellent in abrasion resistance. Accordingly, it is preferred to apply the treatment to the surface to be in contact with the silicon oxide layer of the substrate. Among these treatments, preferred is corona discharge treatment, whereby the water/oil repellent layer will be more excellent in abrasion resistance.

The corona treatment is conducted with a discharge amount (W·min/m$^2$) preferably as large as possible in accordance with the type of the substrate, since the degree of surface modification of the substrate tends to change in proportion to the electric power charged.

(Silicon Oxide Layer)

The silicon oxide layer contains silicon oxide and alkali metal atoms. In view of production efficiency, it preferably contains silicon oxide and sodium. The silicon oxide is preferably a condensate of silicic acid or a hydrolyzed condensate of an alkoxysilane. In view of more excellent adhesion to the water/oil repellent layer and thus more excellent abrasion resistance of the water/oil repellent layer, a condensate of silicic acid is more preferred.

The thickness of the silicon oxide layer is preferably from 2 to 200 nm, particularly preferably from 2 to 20 nm. When the thickness of the silicon oxide layer is at least the lower limit value of the above range, sufficient effects to improve the adhesion by the silicon oxide layer tend to be obtained. When the thickness of the silicon oxide layer is at most the upper limit value of the above range, the silicon oxide layer itself has high abrasion resistance. The method of measuring the thickness of the silicon oxide layer is not particularly limited and for example, a method by observing a cross section of the silicon oxide layer by an electron microscope (such as SEM or TEM) or a method of using an optical interference film thickness meter, a spectroscopic ellipsometer or a profiler may, for example, be mentioned.

In the silicon oxide layer, the average concentration of the alkali metal atoms in a region with a depth from the surface in contact with the water/oil repellent layer of from 0.1 to 0.3 nm is at least $2.0 \times 10^{19}$ atoms/cm$^3$, preferably at least $5.0 \times 10^{19}$ atoms/cm$^3$, particularly preferably at least $1.5 \times 10^{20}$ atoms/cm$^3$. When the average concentration of the alkali metal atoms is at least the above lower limit value, the adhesion between the silicon oxide layer and the water/oil repellent layer will be excellent and as a result, the water/oil repellent layer will be excellent in abrasion resistance. The reason is not clearly understood, however, the following mechanism is considered. That is, the average concentration of the alkali metal atoms being high means that Si-OM (wherein M is an alkali metal) having high reactivity is present in a large amount on the surface of the silicon oxide layer. Si-OM has high reactivity with a silanol group (Si—OH) formed by hydrolysis of the hydrolyzable silyl group in the fluorinated compound having a hydrolyzable silyl group used for forming the water/oil repellent layer. Accordingly, presence of Si-OM in a large amount leads to an increase of the Si—O—Si bond by which the silicon oxide layer and the water/oil repellent layer are connected. As a result, the water/oil repellent layer will hardly be separated, and the water/oil repellent layer will be excellent in abrasion resistance.

The concentration of the alkali metal atoms in the present invention means, in a case where only one type of the alkali metal atoms are contained in the region, the concentration of the alkali metal atoms, and in a case where two or more types of the alkali metal atoms are contained in the region, the total concentration of these alkali metal atoms.

Accordingly, in a case where two or more types of the alkali metal atoms are contained in the region and even in a case where the average concentrations of the respective alkali metal atoms are respectively less than the above lower limit value, the requirement of the present invention is met so long as the average concentration of the total alkali metal atoms is at least the above lower limit value.

Specifically, for example, when the alkali metal atoms contained in the region include Na, and the average Na atom concentration in the region is at least $2.0 \times 10^{19}$ atoms/cm$^3$, the requirement regarding the alkali metal atom concentration in the present invention is met regardless of whether alkali metal atoms other than Na are present or not. Further, when the alkali metal atoms contained in the region are Na and K and even when the average Na atom concentration and the average K atom concentration in the region are respectively less than $2.0 \times 10^{19}$ atoms/cm$^3$, so long as the sum of the average Na atom concentration and the average K atom concentration is at least $2.0 \times 10^{19}$ atoms/cm$^3$, the requirement regarding the alkali metal atom concentration in the present invention is met.

The upper limit value of the average alkali metal atom concentration is not particularly limited, and is preferably $4.0 \times 10^{22}$ atoms/cm$^3$, particularly preferably $1.0 \times 10^{22}$ atoms/cm$^3$, with a view to sufficiently forming the Si—O—Si bond in the silicon oxide layer and sufficiently securing mechanical properties of the silicon oxide layer.

The average concentration of the alkali metal atoms may be obtained in such a manner that a depth-direction profile of the alkali metal atom concentration is obtained by TOF-SIMS (Time-of-Flight Secondary Ion Mass Spectrometry) depth profiling by ion sputtering, and the average alkali metal atom concentration in a region with a depth of from 0.1 to 0.3 nm in the profile is calculated.

TOF-SIMS depth profiling by ion sputtering is conducted by alternately repeating measurement by TOF-SIMS and etching of the surface by ion sputtering using an ion gun built into the TOF-SIMS apparatus.

In the present invention, the reason why the alkali metal atom concentration in a region with a depth from the surface in contact with the water/oil repellent layer of less than 0.1 nm in the silicon oxide layer is excluded is that if the surface of the silicon oxide layer is contaminated with external substances including an alkali metal, the contamination with the alkali metal is reflected in the alkali metal atom concentration profile in the region, and thus the alkali metal atom concentration derived from Si-OM in the silicon oxide layer may not accurately be measured.

The surface roughness (Ra) of the surface (the interface with the water/oil repellent layer) of the silicon oxide layer measured by a scanning probe microscope is preferably at least 0.5 nm from the viewpoint of abrasion resistance. The upper limit of the roughness is not particularly limited, and is preferably at most 10 nm.

The silicon oxide layer is not particularly limited and is preferably a layer formed on the surface of the substrate by wet coating method using a coating fluid consisting of a solution containing a precursor of silicon oxide, an alkali metal source and a solvent (such as water or a water-soluble organic solvent) or a layer formed on the surface of the substrate by dry coating method using silicon oxide containing alkali metal atoms. The details will be described later.

(Water/Oil Repellent Layer)

The water/oil repellent layer in the present invention comprises a hydrolyzed condensate of a fluorinated compound having a hydrolyzable silyl group.

A silanol group (Si—OH) is formed by hydrolysis of the hydrolyzable silyl group (for example, $SiR^{13}_n X^1_{3-n1}$) in the formula (1) in the fluorinated compound having a hydrolyzable silyl group, and such silanol groups are intermolecularly condensed to form a Si—O—Si bond, or the silanol group in the fluorinated compound is condensed with a silanol group (Si—OH) or a OM group (Si-OM) on the surface of the silicon oxide layer to form a chemical bond (Si—O—Si bond). That is, the water/oil repellent layer of the present invention contains the fluorinated compound having a hydrolyzable silyl group in a state where some of or all the hydrolyzable silyl groups in the compound are hydrolyzed and condensed.

The thickness of the water/oil repellent layer is preferably from 1 to 100 nm, particularly preferably from 1 to 50 nm. When the thickness of the water/oil repellent layer is at least the lower limit value of the above range, effects by the surface treatment tend to be sufficiently obtained. When the thickness of the water/oil repellent layer is at most the upper limit value of the above range, high utilization efficiency tends to be obtained.

In the present invention, the thickness obtained by an X-ray diffractometer for thin film analysis is defined as the thickness of the water/oil repellent layer. The thickness of the water/oil repellent layer is calculated from the oscillation period of an interference pattern of reflected X-rays obtained by X-ray reflectometry using an X-ray diffractometer for thin film analysis (manufactured by Rigaku Corporation, ATX-G).

(Fluorinated Compound Having Hydrolyzable Silyl Group)

The fluorinated compound having a hydrolyzable silyl group (hereinafter sometimes referred to simply as "fluorinated compound") is not particularly limited so long as it is capable of forming a water/oil repellent layer. That is, the fluorinated compound is to form a water/oil repellent layer on the exposed surface of the silicon oxide layer.

The fluorinated compound may, for example, be a fluorinated compound having a fluoroalkyl group and a hydrolyzable silyl group, or a fluorinated compound having a group having an etheric oxygen atom between carbon atoms of a fluoroalkyl group and a hydrolyzable silyl group. The fluorinated compound is preferably a fluorinated compound having a perfluoroalkyl group and a hydrolyzable silyl group, or a fluorinated compound having a group having an etheric oxygen atom between carbon atoms of a perfluoroalkyl group and a hydrolyzable silyl group, whereby a water/oil repellent layer excellent in water/oil repellency, fingerprint stain removability, lubricity, etc. can be formed.

Further, the fluorinated compound is also preferably a fluorinated compound having a fluoroalkyl group, a hydrolyzable silyl group and a poly(oxyfluoroalkylene) chain (hereinafter sometimes referred to as "fluorinated ether compound"), whereby a water/oil repellent layer excellent in water/oil repellency, fingerprint stain removability, lubricity, etc. can be formed.

The fluoroalkyl group is, in view of excellent water/oil repellency and low burden on the environment, preferably a $C_{1-20}$ fluoroalkyl group, more preferably a $C_{1-10}$ fluoroalkyl group, further preferably a $C_{1-6}$ fluoroalkyl group, particularly preferably a $C_{1-6}$ linear fluoroalkyl group.

The perfluoroalkyl group is, in view of excellent water/oil repellency and low burden on the environment, preferably a $C_{1-20}$ perfluoroalkyl group, more preferably a $C_{1-10}$ perfluoroalkyl group, further preferably a $C_{1-6}$ perfluoroalkyl group, particularly preferably a $C_{1-6}$ linear perfluoroalkyl group.

The fluorinated compound having a perfluoroalkyl group and a hydrolyzable silyl group may, for example, be a compound represented by the formula (3) in JP-A-2009-139530, paragraphs [0010] and [0022].

The fluorinated ether compound has preferably at least 2, particularly preferably at least 3 hydrolyzable silyl groups, in view of more excellent abrasion resistance of the water/oil repellent layer. The upper limit of the number of the hydrolyzable silyl groups is not particularly limited, and in view of production efficiency, preferably 15, particularly preferably 12.

The poly(oxyfluoroalkylene) chain is preferably one composed of $C_{1-10}$ oxyfluoroalkylene groups, particularly preferably $C_{1-10}$ oxyperfluoroalkylene groups. In view of more excellent abrasion resistance and fingerprint stain removability of the water/oil repellent layer, preferred is one composed of a plural types of $C_{1-10}$ oxyperfluoroalkylene groups. Such a poly(oxyfluoroalkylene) chain may, for example, be one composed of a plurality of $C_1$ oxyperfluoroalkylene groups and a plurality of $C_2$ oxyperfluoroalkylene groups, one composed of $C_1$ oxyperfluoroalkylene groups and a plurality of $C_3$ oxyperfluoroalkylene groups, one composed of a plurality of $C_2$ oxyperfluoroalkylene groups and $C_3$ oxyperfluoroalkylene groups, one composed of a plurality of $C_2$ oxyperfluoroalkylene groups and $C_3$ oxyperfluoroalkylene groups, or one composed of a plurality of $C_2$ oxyperfluoroalkylene groups and a plurality of $C_4$ oxyperfluoroalkylene groups. The plurality of oxyperfluoroalkylene groups may be arranged in blocks, randomly or alternately. In a case where the number of carbon atoms in the oxyperfluoroalkylene group is at least 2, preferred is a linear oxyperfluoroalkylene group.

The poly(oxyperfluoroalkylene) chain is particularly preferably one composed of $C_2$ linear oxyperfluoroalkylene groups and $C_4$ linear oxyperfluoroalkylene groups alternately arranged.

(Compound (X))

As the fluorinated ether compound, compound (X) may be mentioned.

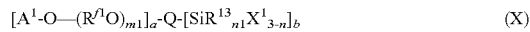

(X)

wherein $A^1$ is a $C_{1-20}$ perfluoroalkyl group, $R^{f1}$ is a $C_{1-10}$ fluoroalkylene group, m1 is an integer of from 2 to 210, $(R^{f1}O)_{m1}$ may be one composed of two or more types of $R^{f1}O$ differing in the number of carbon atoms, "a" and "b" are each independently an integer of at least 1, Q is a (a+b) valent linking group, $R^{13}$ is a hydrogen atom or a monovalent hydrocarbon group, $X^1$ is a hydrolyzable group, n1 is an integer of from 0 to 2, and all of three $[SiR^{13}_{n1}X^1_{3-n1}]$ may not necessarily be the same groups.

<$A^1$ Group>

$A^1$ is, in view of more excellent lubricity and abrasion resistance of the water/oil repellent layer, preferably a $C_{1-20}$ perfluoroalkyl group, more preferably a $C_{1-10}$ perfluoroalkyl group, further preferably a $C_{1-6}$ perfluoroalkyl group, particularly preferably a $C_{1-3}$ perfluoroalkyl group.

<$(R^{f1}O)_{m1}$>

$R^{f1}$ is preferably linear. Further, $R^{f1}$ may be a perfluoroalkylene group or may be a fluoroalkylene group having at least one hydrogen atom.

$R^{f1}$ is preferably the same as the oxyperfluoroalkylene group constituting the above-described preferred poly(oxyperfluoroalkylene) chain.

m1 is an integer of from 2 to 210, preferably an integer of from 5 to 160, particularly preferably an integer of from 10 to 110. When m1 is at least the lower limit value of the above range, the water/oil repellent layer will be excellent in water/oil repellency. When m1 is at most the upper limit value of the above range, the water/oil repellent layer will be excellent in abrasion resistance.

In a case where in $(R^{f1}O)_{m1}$, two or more types of $R^{f1}O$ differing in the number of carbon atoms are present, the bonding order of the respective $R^{f1}O$ is not limited. For example, in a case where two types of $R^{f1}O$ are present, the two types of $R^{f1}O$ may be arranged randomly, alternately or in blocks.

<a and b>

"a" is preferably an integer of from 1 to 10, particularly preferably an integer of from 1 to 4.

(a+b) is preferably an integer of from 2 to 15, particularly preferably an integer of from 2 to 12.

When "a" is 1, b is preferably from 1 to 10, particularly preferably from 1 to 5.

When "a" is an integer of at least 2, b is preferably an integer of at least 1, more preferably an integer of from 1 to 10, particularly preferably an integer of from 1 to 4.

<Q Group>

Q may, for example, be a (a+b) valent alkane group, a group having an atom or a group such as an etheric oxygen atom or an amide group inserted between carbon atoms of the alkane group, or a group having one or more hydrogen atoms bonded to the carbon atom of such a group substituted by a fluorine atom.

<$SiR^{13}_{n1}X^1_{3-n1}$ Group>

$SiR^{13}_{n1}X^1_{3-n1}$ is a hydrolyzable silyl group.

$X^1$ is a hydrolyzable group. The hydrolyzable group is a group converted to a hydroxy group by hydrolysis. That is, Si—$X^1$ at the terminal of the compound (X) is converted to a silanol group (Si—OH) by hydrolysis.

$X^1$ may, for example, be an alkoxy group, a halogen atom, an acyl group or an isocyanate group (—NCO). The alkoxy group is preferably a $C_{1-4}$ alkoxy group.

$R^{13}$ is a hydrogen atom or a monovalent hydrocarbon group. The monovalent hydrocarbon group may, for example, be an alkyl group, a cycloalkyl group, an alkenyl group or an allyl group.

$R^{13}$ is preferably a monovalent hydrocarbon group, particularly preferably a monovalent hydrocarbon group. The number of carbon atoms in the monovalent saturated hydrocarbon group is preferably from 1 to 6, more preferably from 1 to 3, particularly preferably 1 or 2. When the number of carbon atoms of $R^{13}$ is within such a range, the compound (X) is easily produced.

n1 is preferably 0 or 1, particularly preferably 0. By the presence of a plurality of $X^1$ in one hydrolyzable silyl group, adhesion to the substrate will be stronger.

All of three $SiR^{13}{}_{n1}X^{1}{}_{3-n1}$ in the compound (X) may be the same groups, or all may not be the same groups. In view of production efficiency of the compound (X), all of three $SiR^{13}{}_{n1}X^{1}{}_{3-n1}$ are preferably the same group.

As specific examples of the compound (X), for example, the after-described compound (1), a fluorinated ether compound disclosed in WO2013/042732, WO2013/121984, WO2013/121985, WO2013/121986, WO2014/163004, WO2015/087902, WO2017/038830, WO2017/038832, WO2017/187775, JP-A-2014-080473 or JP-A-2015-199906, an organosilicon compound disclosed in WO2011/059430 or WO2011/060047, a silicon-containing organic fluorinated polymer disclosed in Japanese Patent No. 2874715, a perfluoropolyether-modified aminosilane disclosed in JP-A-2000-327772 or JP-A-H11-029585, a fluorinated siloxane disclosed in JP-A-2002-506887, a fluorinated modified hydrogen-containing polymer disclosed in Japanese Patent No. 4138936, a fluoropolyether group-containing polymer-modified silane disclosed in JP-A-2015-199906, JP-A-2016-204656, JP-A-2016-210854 or JP-A-2016-222859, a fluorinated organosilane compound disclosed in WO2012/064649, an organic silicon compound disclosed in JP-A-2000-144097, an organic silicone compound disclosed in JP-A-2008-534696, a perfluoro(poly)ether-containing silane compound disclosed in Patent Document 1, a fluorooxyalkylene group-containing polymer disclosed in Patent Document 2, and a compound disclosed in Patent Document 3, JP-A-2014-070163 or U.S. Patent Application Publication No. 2010/0129672 may be mentioned.

As commercial products of the compound (X), KY-100 series (KY-178, KY-185, KY-195, etc.) manufactured by Shin-Etsu Chemical Co., Ltd., Afluid (registered trademark) S550 manufactured by Asahi Glass Company, Limited, OPTOOL (registered trademark) DSX, OPTOOL (registered trademark) AES, OPTOOL (registered trademark) UF503, OPTOOL (registered trademark) UD509, etc., manufactured by DAIKIN INDUSTRIES LTD. may, for example, be mentioned.

(Compound (1))

The compound (1) is an example of the compound (X).

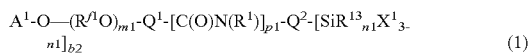

$A^{1}$—O—$(R^{f1}O)_{m1}$-$Q^{1}$-$[C(O)N(R^{1})]_{p1}$-$Q^{2}$-$[SiR^{13}{}_{n1}X^{1}{}_{3-n1}]_{b2}$ (1)

wherein $Q^{2}$ is —$R^{11}$—C(—$R^{12}$—)$_{3}$ or $R^{13}$, and when $Q^{2}$ is —$R^{11}$—C(—$R^{12}$—)$_{3}$, b2 is 3, and when $Q^{2}$ is $R^{13}$, b2 is 1.

In the compound (1), $A^{1}$, $R^{f1}$, m1, $R^{13}$, $X^{1}$ and n1 are the same as in the above formula (X), $Q^{1}$ is a linear $C_{1-10}$ fluoroalkylene group, $R^{1}$ is a hydrogen atom or a $C_{1-10}$ alkyl group, p1 is 0 or 1, $R^{11}$ is a single bond, an alkylene group, a group having an etheric oxygen atom at the terminal (the terminal on the side bonded to C(—$R^{12}$—)$_{3}$) of an alkylene group, a group having an etheric oxygen atom between carbon atoms of an alkylene group having at least 2 carbon atoms, or a group having an etheric oxygen atom at the terminal (the terminal on the side bonded to C(—$R^{12}$—)$_{3}$) and between carbon atoms of an alkylene group having at least 2 carbon atoms, and $R^{12}$ and $R^{13}$ are each independently an alkylene group, a group having an etheric oxygen atom at the terminal (excluding the terminal on the side bonded to Si) of an alkylene group, or a group having an etheric oxygen atom between carbon atoms of an alkylene group having at least 2 carbon atoms.

<$Q^{1}$ Group>

$Q^{1}$ may be a linear perfluoroalkylene group, or may be a linear fluoroalkylene group containing at least one hydrogen atom. By the compound (1) wherein $Q^{1}$ is linear, a water/oil repellent layer excellent in abrasion resistance and lubricity can be formed.

<$[C(O)N(R^{1})]_{p1}$ Group>

When p1 is 1, the compound (1) has an amide bond, however, by the carbon atom at the terminal on the side bonded to $[C(O)N(R^{1})]$ of $Q^{1}$ having at least one fluorine atom bonded, the polarity of the amide bond tends to be small, and the water/oil repellency of the water/oil repellent layer is less likely to lower. Whether p1 is 0 or 1 can be selected in view of production efficiency.

$R^{1}$ in the $[C(O)N(R^{1})]_{p1}$ group is preferably a hydrogen atom in view of production efficiency of the compound (1). When $R^{1}$ is an alkyl group, the alkyl group is preferably a $C_{1-4}$ alkyl group.

<$R^{11}$ Group>

When p1 is 0, $R^{11}$ is, in view of production efficiency of the compound (1), preferably a single bond or a group selected from the group consisting of —$CH_{2}$O—, —$CH_{2}OCH_{2}$—, —$CH_{2}OCH_{2}CH_{2}$O— and —$CH_{2}OCH_{2}CH_{2}OCH_{2}$— (provided that the left side is bonded to $Q^{1}$).

When p1 is 1, $R^{11}$ is, in view of production efficiency of the compound (1), preferably a single bond or a group selected from the group consisting of —$CH_{2}$— and —$CH_{2}CH_{2}$—.

<$R^{12}$ Group, $R^{13}$ Group>

The $R^{12}$ and $R^{13}$ groups are, in view of production efficiency of the compound (1), each independently preferably a group selected from the group consisting of —$CH_{2}CH$—, —$CH_{2}CH_{2}CH_{2}$—, —$CH_{2}OCH_{2}CH_{2}CH_{2}$— and —$OCH_{2}CH_{2}CH$— (provided that the right side is bonded to Si).

All of the three $R^{12}$ in the compound (1) may be the same groups or may not be the same groups.

<Preferred Embodiment of —$(R^{f1}O)_{m1}$-$Q^{1}$->

—$(R^{f1}O)_{m1}$-$Q^{1}$- in the compound (1) is, in view of more excellent abrasion resistance and fingerprint stain removability of the water/oil repellent layer, preferably -$Q^{11}$-$(R^{F1}O)_{m10}$-$Q^{12}$-, wherein $Q^{11}$ is a single bond, a linear fluoroalkylene group containing at least one hydrogen atom, a group having an etheric oxygen atom at the terminal (excluding the terminal on the side bonded to $A^{1}$-O) of a linear fluoroalkylene group containing at least one hydrogen atom, a group having an etheric oxygen atom between carbon atoms of a linear fluoroalkylene group having at least 2 carbon atoms and containing at least one hydrogen atom, or a group having an etheric oxygen atom at the terminal (excluding the terminal on the side bonded to $A^{1}$-O) and between carbon atoms of a linear fluoroalkylene group having at least 2 carbon atoms and containing at least one hydrogen atom (provided that the number of oxygen atoms is at most 10), $R^{F1}$ is a linear perfluoroalkylene group, m10 is an integer of from 2 to 200, $(R^{F1}O)_{m10}$ may be one consisting of two or more types of $R^{F1}$O differing in the number of carbon atoms, and $Q^{12}$ is a linear perfluoroalkylene group, a linear fluoroalkylene group containing at least one hydrogen atom, or a group having an etheric oxygen atom between carbon atoms of a linear fluoroalkylene group having at least 2 carbon atoms and containing at least one hydrogen atom.

<$Q^{11}$ Group>

In a case where $Q^{11}$ is a linear fluoroalkylene group containing at least one hydrogen atom, or a group having an etheric oxygen atom between carbon atoms of a linear fluoroalkylene group having at least 2 carbon atoms and containing at least one hydrogen atom, and where no etheric oxygen atom is present at the terminal on the side bonded to $(R^{F1}O)_{m1}$ of $Q^{11}$, the carbon atom at the terminal on the side bonded to $(R^{F1}O)_{m10}$ of $Q^{11}$ has at least one hydrogen atom bonded.

$Q^{11}$ is, in view of production efficiency of the compound (11), preferably a single bond or a group selected from the group consisting of —CHFCF$_2$OCH$_2$—, —CF$_2$CHFCF$_2$OCH$_2$—, —CF$_2$CF$_2$CHFCF$_2$OCH$_2$—, —CF$_2$CF$_2$OCHFCF$_2$OCH$_2$—, —CF$_2$CF$_2$OCF$_2$CF$_2$OCHFCF$_2$OCH$_2$—, —CF$_2$CH$_2$OCH$_2$— and —CF$_2$CF$_2$OCF$_2$CH$_2$OCH$_2$-(provided that the left side is bonded to A$^1$-O).

<$(R^{F1})_{m10}$>

Preferred embodiment of $R^{F1}$ is the same as the above-described preferred embodiment of $R^{f1}$.

The preferred range of m10 is the same as the above-described preferred range of m1.

In a case where in $(R^{F1}O)_{m10}$, two or more types of $R^{F1}O$ differing in the number of carbon atoms are present, the bonding order of the respective $R^{F1}O$ is not limited.

$(R^{F1}O)_{m10}$ may, for example, be $\{(CF_2O)_{m11}(CF_2CF_2O)_{m12}\}$, $(CF_2CF_2O)_{m13}$, $(CF_2CF_2CF_2O)_{m14}$ or $(CF_2CF_2O—CF_2CF_2CF_2CF_2O)_{m15}$.

Here, m11 is an integer of at least 1, m12 is an integer of at least 1, m11+m12 is an integer of from 2 to 200, and the bonding order of m11 pieces of CF$_2$O and m12 pieces of CF$_2$CF$_2$O is not limited. m13 and m14 are an integer of from 2 to 200, and m15 is an integer of from 1 to 100. Further, $\{(CF_2O)_{m11}(CF_2CF_2O)_{m12}\}$ represents a random copolymer chain of (CF$_2$O) and (CF$_2$CF$_2$O) having m11 pieces of (CF$_2$O) and m12 pieces of (CF$_2$CF$_2$O).

<Q12 Group>

When p1 is 0, $Q^{12}$ is, for example, in a case where $(R^{F1}O)_{m10}$ is $\{((CF_2O)_{m11}(CF_2CF_2O)_{m12}\}$ or $(CF_2CF_2O)_{m13}$, a C$_1$ perfluoroalkylene group, in a case where $(R^{F1}O)_{m10}$ is $(CF_2CF_2CF_2O)_{m14}$, a C$_2$ perfluoroalkylene group, and in a case where $(R^{F1}O)_{m10}$ is $(CF_2CF_2O—CF_2CF_2CF_2CF_2O)_{m15}$, a C$_3$ linear perfluoroalkylene group.

When p1 is 1, as $Q^{12}$, the following groups may be mentioned.

(i) A perfluoroalkylene group (ii) A group having R$^F$CH$_2$O (wherein R$^F$ is a perfluoroalkylene group) on the side bonded to $(R^{F1}O)_{m10}$ and having a fluoroalkylene group (which may have an etheric oxygen atom between carbon atoms) containing at least one hydrogen atom on the side bonded to C(O)N(R$^1$).

As $Q^{12}$ in (ii), in view of production efficiency of the compound (1), the following groups are preferred.

—R$^F$CH$_2$O—CF$_2$CHFOCF$_2$CF$_2$CF$_2$—, —R$^F$CH$_2$O—CF$_2$CHFCF$_2$OCF$_2$CF$_2$—, —R$^F$CH$_2$O—CF$_2$CHFCF$_2$OCF$_2$CF$_2$CF$_2$—, —R$^F$CH$_2$O—CF$_2$CHFOCF$_2$CF$_2$CF$_2$OCF$_2$CF$_2$—.

By the compound (1) wherein $Q^{12}$ is linear, a water/oil repellent layer excellent in abrasion resistance and lubricity can be formed.

<Preferred Embodiment of Compound (1)>

As the compound (1), for example, the following compounds may be mentioned. The compounds are preferred in that they are industrially easily produced, easily handled, and capable of forming a water/oil repellent layer more excellent in water/oil repellency, abrasion resistance, fingerprint stain removability, lubricity and outer appearance.

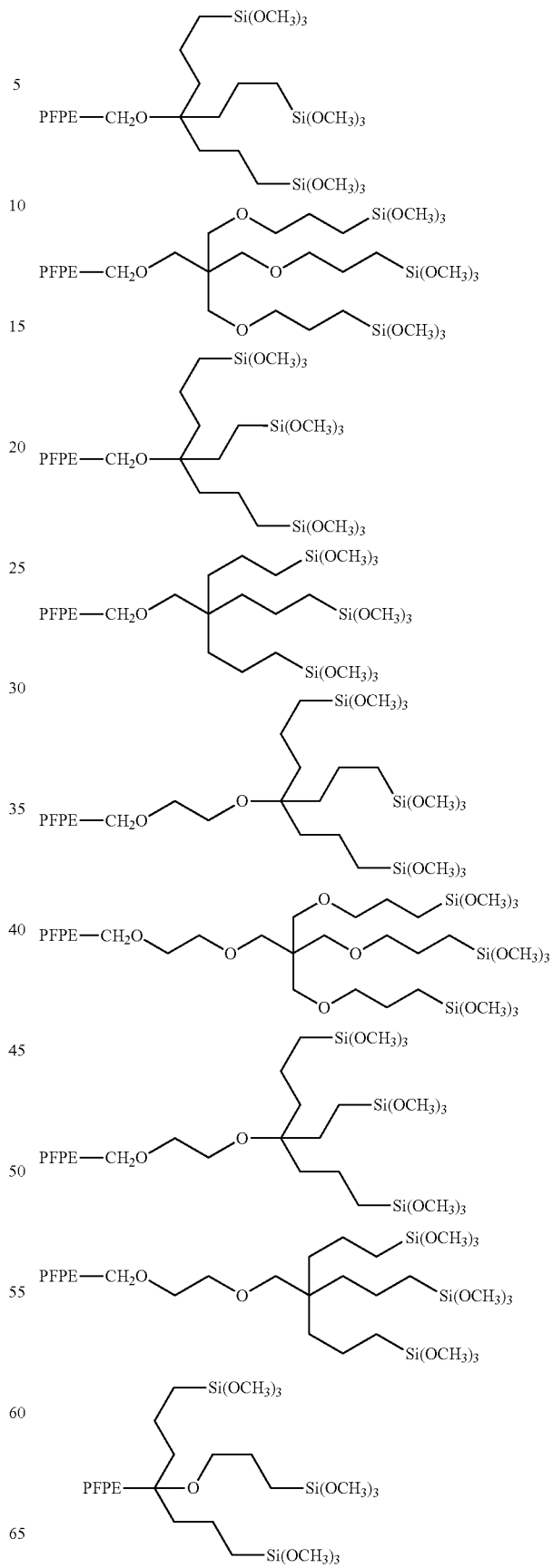

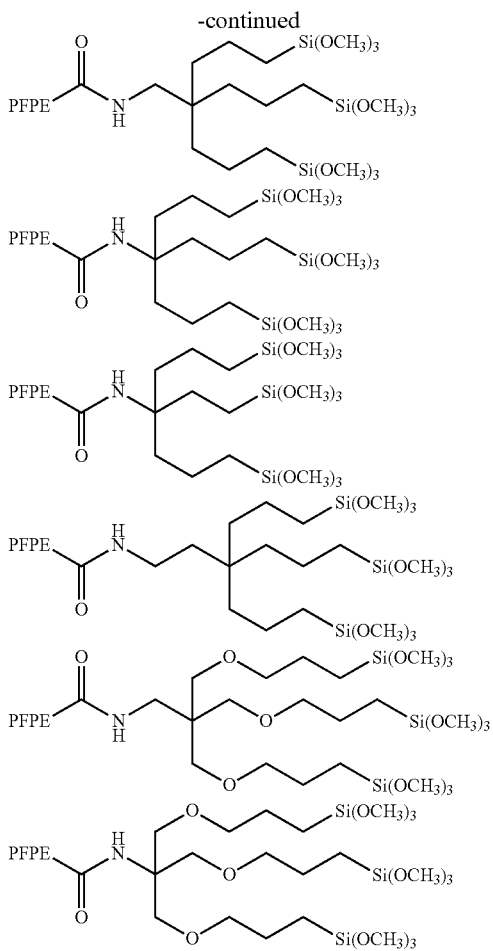

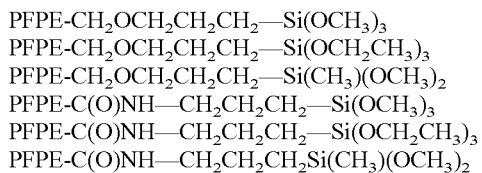

PFPE-CH$_2$OCH$_2$CH$_2$CH$_2$—Si(OCH$_3$)$_3$
PFPE-CH$_2$OCH$_2$CH$_2$CH$_2$—Si(OCH$_2$CH$_3$)$_3$
PFPE-CH$_2$OCH$_2$CH$_2$CH$_2$—Si(CH$_3$)(OCH$_3$)$_2$
PFPE-C(O)NH—CH$_2$CH$_2$CH$_2$—Si(OCH$_3$)$_3$
PFPE-C(O)NH—CH$_2$CH$_2$CH$_2$—Si(OCH$_2$CH$_3$)$_3$
PFPE-C(O)NH—CH$_2$CH$_2$CH$_2$Si(CH$_3$)(OCH$_3$)$_2$

Here, PFPE is a polyfluoropolyether chain, that is, $A^1$-O-$Q^{11}$-$(R^{F1}O)_{m10}$-$Q^{12}$-. A preferred embodiment of PFPE is a combination of the above-described preferred $A^1$, $Q^{11}$, $(R^{F1}O)_{m10}$ and $Q^{12}$.

[Method for Producing Water/Oil Repellent Layer-Provided Article]

The method for producing a water/oil repellent layer-provide article of the present invention is a method for producing a water/oil repellent layer-provided article, comprising (a) forming a silicon oxide layer containing alkali metal atoms on the surface of a substrate using a silicon oxide-forming material containing a silicon oxide precursor and an alkali metal source, and then (b) forming on the surface of the silicon oxide layer a water/oil repellent layer comprising a hydrolyzed condensate of a fluorinated compound having a hydrolyzable silyl group, wherein the silicon oxide layer is a silicon oxide layer having the above alkali metal atom concentration.

The silicon oxide precursor may, for example, be silicic acid, a partial condensate of silicic acid, an alkali metal silicate, a silane compound having a hydrolyzable group bonded to the silicon atom, or a partially hydrolyzed condensate of the silane compound. Silicic acid or its partial condensate may be formed into silicon oxide by dehydration condensation, the alkali metal silicate may be formed into silicic acid or its partial condensate by an acid or a cation exchange resin, and the formed silicic acid or its partial condensate may be formed into silicon oxide by dehydration condensation. The hydrolyzable group in the silane compound having a hydrolyzable group bonded to the silicon atom may, for example, be an alkoxy group or a chlorine atom. The hydrolyzable group in the silane compound may be hydrolyzed to form a hydroxy group, and the formed silanol compound may be formed into silicon oxide by dehydration condensation. The silane compound having a hydrolyzable group bonded to the silicon atom may, for example, be an alkoxysilane such as a tetraalkoxysilane or an alkyltrialkoxysilane, or tetrachlorosilane.

The silicon oxide precursor is preferably silicic acid, a partial condensate of silicic acid, a tetraalkoxysilane or its partially hydrolyzed condensate.

The alkali metal source may, for example, be an alkali metal hydroxide or a water-soluble alkali metal salt. The water-soluble alkali metal salt may, for example, be an alkali metal carbonate, an alkali metal hydrogen carbonate, an alkali metal hydrochloride or an alkali metal nitrate. The alkali metal source is preferably an alkali metal hydroxide or an alkali metal carbonate.

Further, the alkali metal silicate may be used as the silicon oxide precursor and as the alkali metal source. As mentioned, above, the alkali metal silicate may be converted to silicon oxide via silicic acid, and on that occasion, a small amount of the alkali metal remains in the formed silicon oxide in many cases. Accordingly, silicon oxide containing a predetermined amount of alkali metal atoms can be obtained by adjusting the amount of the remaining alkali metal intentionally.

As a method of forming the silicon oxide layer containing alkali metal atoms, the following (a1) or (a2) is preferred. The method (a1) is a method employing the above wet coating, and the method (a2) is a method employing the above dry coating.

(a1): A method of forming a silicon oxide layer on the surface of a substrate by using a coating fluid containing at least one silicon oxide precursor selected from the group consisting of silicic acid, a partial condensate of silicic acid, an alkoxysilane and its partially hydrolyzed condensate, an alkali metal source, and a solvent.

(a2): A method of forming the silicon oxide layer on the surface of a substrate by using silicon oxide containing alkali metal atoms.

(a1)

The coating fluid for forming a silicon oxide layer preferably contains, with a view to easily forming the silicon oxide layer, as the silicon oxide precursor, at least one member selected from the group consisting of silicic acid and its partial condensate, particularly preferably contains a partial condensate of silicic acid.

It is preferred to use, as a material for producing silicic acid or its partial condensate, an alkali metal silicate. By using an alkali metal silicate, alkali metal atoms can be contained at a predetermined concentration in the formed silicon oxide layer. Otherwise, the alkali metal atom concentration in the formed silicon oxide layer may be adjusted by using an alkali metal source such as an alkali metal hydroxide.

Specifically, preferred is a preparation method of subjecting an aqueous alkali metal silicate solution to demineralization treatment to obtain an aqueous silicic acid solution, and adding a water-soluble organic solvent to the aqueous silicic acid solution. By properly selecting the demineralization treatment conditions, a preferred amount of the alkali metal atoms can be contained in the aqueous silicic acid solution. As a method of the demineralization treatment, for example, the aqueous alkali metal silicate solution is mixed with a cation exchange resin, followed by stirring, and the cation exchange resin is removed. The alkali metal silicate used in such a method is preferably sodium silicate.

The alkali metal silicate may be a silicate represented by $M_2O \cdot nSiO_2$, specifically, a metasilicate ($M_2SiO_3$), an orthosilicate ($M_4SiO_4$), a bisilicate ($M_2Si_2O_5$) or a tetrasilicate ($M_2Si_4O_9$).

For example, as sodium silicate, $Na_2O \cdot nSiO_2$ as defined in JIS K1408-1966 may be mentioned, and specifically, sodium metasilicate ($Na_2SiO_3$), sodium orthosilicate ($Na_4SiO_4$), sodium bisilicate ($Na_2Si_2O_5$) or sodium tetrasilicate ($Na_2Si_4O_9$) may, for example, be mentioned.

The solvent is preferably water or a water-soluble organic solvent. The water-soluble organic solvent may, for example, be an alcohol organic solvent, a ketone organic solvent, an ether organic solvent or an ester organic solvent, and is preferably an alcohol organic solvent. The alcohol organic solvent may, for example, be isopropyl alcohol, ethanol or n-butanol.

The solid content concentration (as calculated as $SiO_2$) of coating fluid is preferably from 0.001 to 10 mass %, particularly preferably from 0.1 to 3 mass %.

As a method of applying the coating fluid to the surface of a substrate by wet coating, a spin coating method, a wipe coating method, a spray coating method, a squeegee coating method, a dip coating method, a die coating method, an ink-jet method, a flow coating method, a roll coating method, a casting method, a Langmuir-Blodgett method or a gravure coating method may, for example, be mentioned.

The coating fluid is applied to the surface of a substrate by wet coating to form a wet film, and then the solvent in the wet film is removed, and the silicic acid and its partial condensate are condensed to form the silicon oxide layer.

The temperature when the solvent is removed from the wet film and the temperature at the time of condensation of silicic acid and its partial condensate are preferably from 0 to 600° C., and with a view to forming a dense silicon oxide layer, particularly preferably from 200 to 600° C.

(a2)

As the method of carrying out dry coating using silicon oxide containing alkali metal atoms, in view of excellence in simplicity of the process, a vacuum deposition method, a CVD method or a sputtering method may, for example, be mentioned. In view of simplicity of apparatus, a vacuum deposition method is particularly preferred.

In a case where at least two types of silicon oxide containing alkali metal atoms are deposited by the vacuum deposition method, they are deposited from one deposition source, or may be co-deposited from separate deposition sources. Particularly preferred is to use one deposition source consisting of silicon oxide containing alkali metal atoms. For example, in a case where a silicon oxide layer containing two or more types of alkali metal atoms is to be formed, it is preferred to use one deposition source consisting of silicon oxide containing two or more types of alkali metal atoms.

The alkali metal atom-containing silicon oxide used in the dry coating method, such as the deposition source in the vacuum deposition method, is preferably an alkali metal atom-containing silicon oxide wherein the content of the alkali metal atoms is at least 200 ppm to Si. The content of the alkali metal atoms to Si is more preferably at least 1,000 ppm, particularly preferably at least 10,000 ppm. When the content of the alkali metal atoms is at least the lower limit value of the above range, excellent adhesion between the formed silicon oxide layer and the water/oil repellent layer will be achieved and as a result, the water/oil repellent layer will be excellent in abrasion resistance. The upper limit of the content of the alkali metal atoms to Si is preferably 200,000 ppm, particularly preferably 100,000 ppm.

As a method for producing the alkali metal atom-containing silicon oxide, a method of adding silicon dioxide to an alkali metal source-containing aqueous solution, followed by stirring, and removing water may be mentioned. As the silicon dioxide, porous silicon dioxide such as silica gel is preferred. The alkali metal source-containing aqueous solution may, for example, be an aqueous alkali metal hydroxide solution or an aqueous alkali metal carbonate solution. Otherwise, the alkali metal atom-containing silicon oxide may be produced from the coating fluid for forming a silicon oxide layer in the above method (a1).

Otherwise, porous silica gel containing alkali metal atoms, produced from an alkali metal silicate such as sodium silicate, or porous silica gel containing alkali metal atoms obtained by impregnating the above porous silica gel with an aqueous solution containing an alkali metal source, followed by drying or firing, or the like may be used as the alkali metal atom-containing silicon oxide. As silicon oxide containing alkali metal atoms, commercial products may be used, and porous spherical silica gel produced from sodium silicate such as M. S. GEL (tradename, manufactured by AGC Si-Tech Co., Ltd.) may be mentioned.

The shape of the alkali metal atom-containing silicon oxide is not limited, and a powder, beads, pellets or cullet may, for example, be mentioned. Preferred is beads, pellets or cullet, which can be easily used as e.g. the deposition source. The method for producing the pellets is not limited, and for example, a method of pressing a powder to form a pellet-shape formed product may be mentioned. The size of the pellet-shape formed product is not particularly limited, and for example, a diameter of at least 1 cm is preferred, since if the pellets are too small, they fly too much at the time of coating, such being unfavorable. As a method for producing cullet, a method of cutting glass obtained by adding calcium by a cutter, followed by grinding may be mentioned.

(b)

After the silicon oxide layer containing alkali metal atoms is formed, on its exposed surface, a water/oil repellent layer comprising a hydrolyzed condensate of a fluorinated compound having a hydrolyzable silyl group is formed. As the forming method, dry coating or wet coating may be mentioned. The exposed surface of the silicon oxide layer in the silicon oxide layer-provided substrate means the surface of the silicon oxide layer on which the water/oil repellent layer is to be formed.

<Dry Coating>

The dry coating method may, for example, be a vacuum deposition method, a CVD method or a sputtering method, and is particularly preferably a vacuum deposition method, with a view to suppressing deposition of the fluorinated compound having a hydrolyzable silyl group and in view of simplicity of apparatus.

The temperature at the time of vacuum deposition is preferably from 20 to 300° C., particularly preferably from 30 to 200° C.

The pressure at the time of vacuum deposition is preferably at most $1 \times 10^{-1}$ Pa, particularly preferably at most $1 \times 10^{-2}$ Pa.

In the dry coating, one type of a fluorinated compound having a hydrolyzable silyl group may be used alone, two or more types of fluorinated compounds having a hydrolyzable silyl group may be used as a mixture, a composition containing a fluorinated compound having a hydrolyzable silyl group and other component (excluding the solvent) may be used, or a solution or dispersion having a solvent added to such a component may be used.

<Wet Coating>

The wet coating method may, for example, be a spin coating method, a wipe coating method, a spray coating method, a squeeze coating method, a dip coating method, a die coating method, an ink-jet method, a flow coating method, a roll coating method, a casting method, a Langmuir-Blodgett method or a gravure coating method.

In the wet coating, a coating fluid for forming a water/oil repellent layer is used.

The coating fluid for forming a water/oil repellent layer is a solution or dispersion containing the fluorinated compound having a hydrolyzable silyl group and a solvent.

The solvent is preferably an organic solvent. The organic solvent may be a fluorinated organic solvent or may be a non-fluorinated organic solvent, or may contain both the solvents.

The fluorinated organic solvent may, for example, be a fluorinated alkane, a fluorinated aromatic compound, a fluoroalkylether, a fluorinated alkylamine or a fluoroalcohol.

The non-fluorinated organic solvent is preferably a compound consisting solely of hydrogen atoms and carbon atoms or a compound consisting solely of hydrogen atoms, carbon atoms and oxygen atoms and may be a hydrocarbon-based organic solvent, an alcohol-based organic solvent, a ketone-based organic solvent, an ether-based organic solvent or an ester-based organic solvent.

The coating fluid for forming a water/oil repellent layer may contain, in addition to the fluorinated compound having a hydrolyzable silyl group and the solvent, within a range not to impair the effects of the present invention, other components and impurities (such as by-products formed in the process for producing the fluorinated compound having a hydrolyzable silyl group).

Other components may, for example, be known additives such as an acid catalyst or a basic catalyst which accelerates hydrolysis and condensation of the hydrolyzable silyl group.

The solid content concentration of the coating fluid for forming a water/oil repellent layer is preferably from 0.001 to 10 mass %, particularly preferably from 0.01 to 1 mass %. The solid content concentration of the coating fluid for forming a water/oil repellent layer is a value calculated from the mass of the coating fluid for forming a water/oil repellent layer before heating and the mass after heating in a convection oven at 120° C. for 4 hours.

<Post Processing>

In (b), in order to improve abrasion resistance of the water/oil repellent layer, as the case requires, an operation to accelerate the reaction between the fluorinated compound having a hydrolyzable silyl group and the silicon oxide layer may be conducted. Such an operation may, for example, be heating, humidification or light irradiation. For example, the silicon oxide layer-provided substrate having a water/oil repellent layer formed thereon is heated in the air containing moisture to accelerate e.g. hydrolysis of the hydrolyzable silyl group into a silanol group, formation of a siloxane bond by condensation of the silanol group, or condensation of the silanol group and the OM group on the surface of the silicon oxide layer and the silanol group of the fluorinated compound.

After the surface treatment, the compound in the water/oil repellent layer, which is not chemically bonded to other compound or the silicon oxide layer, may be removed as the case requires. As a specific method, for example, a method of rinsing the water/oil repellent layer with a solvent, or a method of wiping the water/oil repellent layer with cloth impregnated with a solvent may be mentioned.

EXAMPLES

Now, the present invention will be described in further detail with reference to Examples. However, it should be understood that the present invention is by no means restricted thereto.

Ex. 1 to 2, 4 to 8, 9 to 10 and 12 to 30 are Examples of the present invention, and Ex. 3, 11 and 31 are Comparative Examples.

[Physical Properties and Evaluation]

(Number Average Molecular Weight)

The number average molecular weight of the fluorinated ether compound was calculated by obtaining the number (average value) of oxyperfluoroalkylene groups based on the terminal group by $^1$H-NMR and $^{19}$F-NMR. The terminal group may, for example, be $A^1$ or $SiR^{13}{}_{n1}X^1{}_{3-n1}$ in the formula (1).

(Thickness of Silicon Oxide Layer)

The thickness of the silicon oxide layer was measured by a spectrum ellipsometer (FE-3000 manufactured by Otsuka Electronics Co., Ltd.).

(TOF-SIMS)

The average sodium concentration in a region with a depth from the surface in contact with the water/oil repellent layer of at least 0.1 nm and at most 0.3 nm in the silicon oxide layer, was obtained by using a Time-of-Flight Secondary Ion Mass Spectrometry (TOF-SIMS) apparatus in accordance with the following procedure.

(I) First, a standard sample for quantitative determination of sodium concentration was prepared. A quartz glass substrate having the same composition as the silicon oxide layer to be evaluated was prepared, and ion implantation of sodium into the substrate was conducted to prepare a standard sample. For ion implantation, a medium-electric current ion implantation apparatus (IMX-3500RS manufactured by ULVAC, Inc.) was used, and the energy was 110 keV and the sodium implantation amount was $6.0 \times 10^{14}$ ions/cm$^2$.

(II) Then, the silicon oxide layer-provided substrate to be evaluated and the standard sample prepared in (I) were transferred into the TOF-SIMS apparatus simultaneously, TOF-SIMS depth profiling by sputtering was conducted in order, and a profile of the sputtering time (vertical axis) and the intensity of $^{23}$Na$^+$ and $^{26}$Si$^+$ (horizontal axis) was obtained.

Then, the sputtering time on the horizontal axis of the obtained profile was converted to the depth employing the depth of the standard sample. The depth of the standard sample was measured by using a stylus surface profiler (Dektak150 manufactured by ULVAC, Inc.).

Figure 2:
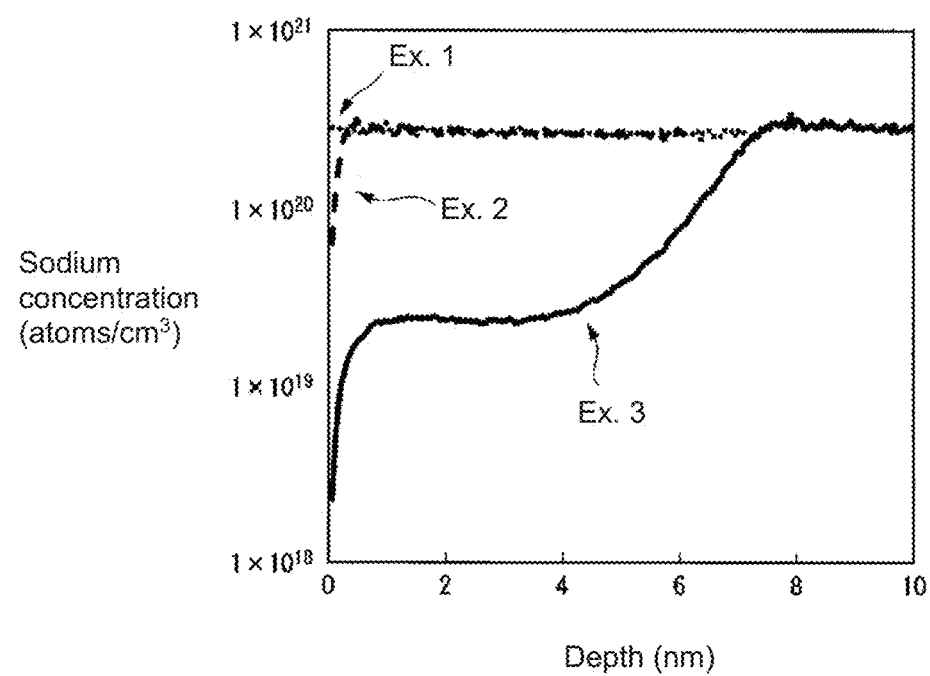
FIG. 2 is a graph illustrating the relation between, of a silicon oxide layer-provided substrate, the depth from a surface in contact with a water/oil repellent layer, and the sodium concentration at the depth obtained by TOF-SIMS.
Figure 3:
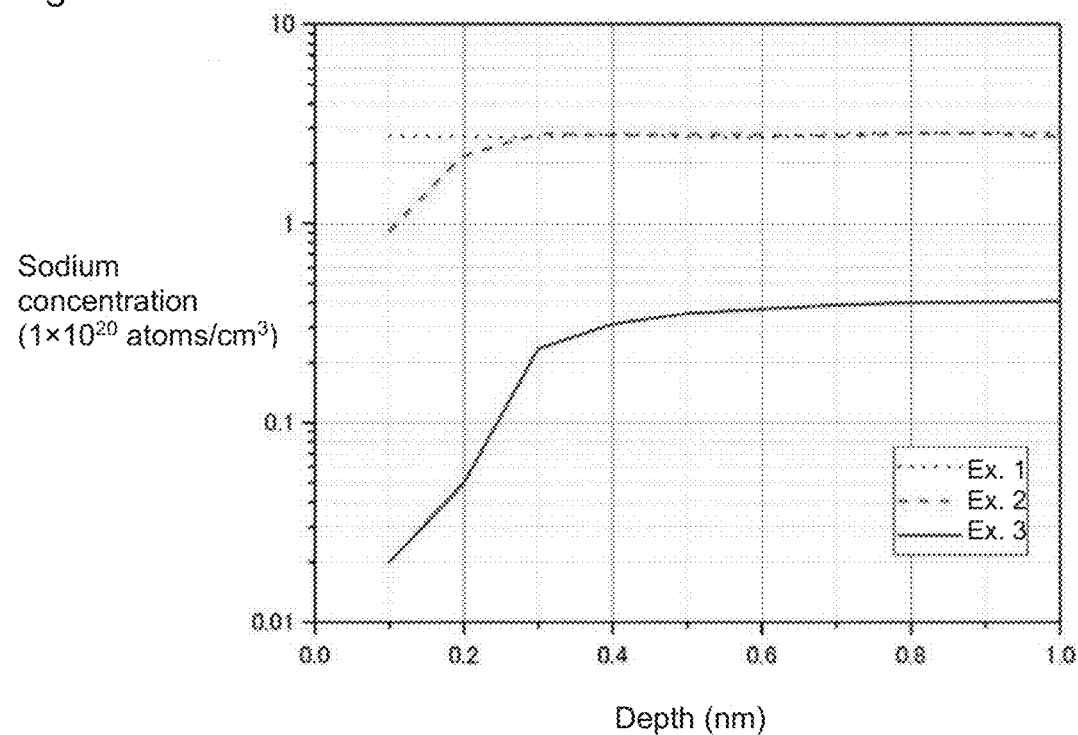
FIG. 3 is a graph having the horizontal axis of FIG. 2 expanded.

Then, the intensity on the vertical axis of the obtained profile was converted into the sodium concentration employing the sputtering rate (0.0282 nm/sec) of sputter ions obtained from the standard sample and RSF ($2.8182 \times 10^{20}$; relative sensitivity factor) calculated from the depth profile of the standard sample, to obtain the depth profile of the sodium concentration of the silicon oxide layer (FIGS. 2 and 3).

The TOF-SIMS conditions employed in the Examples were as follows.

TOF-SIMS apparatus: TOF.SIMS5 manufactured by ION-TOF GmbH
  Primary ion species: $Bi_1^+$
  Primary ion accelerating voltage: 25 keV
  Primary ion current: 1 pA (at 10 kHz)
  Primary ion duster size: 100×100 μm$^2$
  Primary ion bunching: conducted
  Cycle time: 100 μs
  Number of pixels: 128×128 pixels
  Sputtering ion species: $C_{60}^{++}$
  Sputtering accelerating voltage: 10 keV
  Sputtering current: 1 nA (at 10 kHz)
  Sputtering ion cluster size: 400×400 μm$^2$
  Sputtering time per cycle: 1.634 seconds
  Degree of vacuum: $5.0\times10^{-6}$ mbar (oxygen flow into measurement chamber conducted)
  Mass number of Na secondary ions: 23
  Mass number of Si secondary ions: 28
  Flood gun: used (III) Finally, from the depth profile of the sodium concentration of the silicon oxide layer obtained in (II), the average sodium concentration in a region with a depth from the surface in contact with the water/oil repellent layer of at least 0.1 nm and at most 0.3 nm was calculated. The number of points plotted in the region with a depth of at least 0.1 nm and at most 0.3 nm in the depth profile of the sodium concentration was four. The average sodium concentration was obtained as the average value at these four points. When measurement is conducted under the above conditions, four points may be present in a region with a depth from the surface in contact with the water/oil repellent layer of at least 0.1 nm and at most 0.3 nm.

It is preferred that the silicon oxide layer is exposed before the TOF-SIMS depth profiling by ion sputtering. That is, in a case where the water/oil repellent layer is present on the surface of the silicon oxide layer or in a case where the surface is distinctly contaminated, they are preferably removed. As the removal method, oxygen plasm ashing treatment or ultraviolet (UV) ozone treatment may, for example, be mentioned. Depending upon the thickness of the water/oil repellent layer or the degree of surface contamination, both should be conducted.

In Examples, oxygen plasm ashing treatment was conducted, then UV ozone treatment was conducted. For the oxygen plasma ashing treatment, a low temperature ashing apparatus (LTA-102 model manufactured by YANACO BUNSEKI KOGYO) was used. The treatment conditions were such that the radiofrequency output: 50 W, oxygen flow: 50 mL/min, and the treatment time: 60 minutes. For the UV ozone treatment, an ultraviolet irradiation apparatus (PL30-200 manufactured by SEN ENGINEERING CO., LTD.) was used, and UB2001D-20 was used as an ultraviolet irradiation apparatus power source. The treatment conditions were such that the ultraviolet wavelength: 254 nm, and the treatment time was 10 minutes.

In a case where TOF-SIMS depth profile by ion sputtering is carried out with respect to a water/oil repellent layer-provided article, it is preferred to confirm that fluorine is removed by monitoring the fluorine peak by X-ray photo-electron spectroscopy, although it is unnecessary in Examples since TOF-SIMS depth profiling by ion sputtering with respect to the silicon oxide layer-provided substrate was carried out.

Further, the concentration of alkali metals other than sodium was also measured in the same manner as the measurement of the sodium concentration.

(Surface Roughness (Ra))

Ra was measured by using a scanning probe microscope (manufactured by SII NanoTechnology Inc., model: SPA400). The cantilever was SI-DF40 (with back Al), XY data number was 256, and the scanning area was 10 μm×10 μm.

(Water Contact Angle)

The contact angle of about 2 μL of distilled water placed on the surface of the water/oil repellent layer was measured by a contact angle measuring apparatus (DM-701 manufactured by Kyowa Interface Co., Ltd.) at 20° C. Measurement was conducted on different five points on the surface of the water/oil repellent layer, and the average value was calculated.

(Steel Wool Abrasion Test)

With respect to the water/oil repellent layer, the water contact angle was measured in accordance with JIS L0849: 2013 (ISO 105-X12: 2001) using a reciprocating traverse testing machine (manufactured by KNT Co.), wherein steel wool BON STAR (yam number #0000, dimensions: 5 mm×10 mm×10 mm) was reciprocated under a load of 9.8N at a rate of 80 rpm. The water contact angle of the water/oil repellent layer was measured every predetermined time of abrasion by steel wool, and a case where the water contact angle was at least 100° was rated as ○ (good), and a case where it was less than 100° was rated as x (poor). The smaller the decrease in water contact angle after abrasion, the smaller the decrease in performance due to abrasion, and the more excellent the abrasion resistance.

(Felt Abrasion Test)

With respect to the water/oil repellent layer, using a felt abrasion testing machine, felt (dimensions: 10 mm×10 mm×50 mm) was reciprocated under a load of 9.8N at a rate of 80 rpm. The water contact angle of the water/oil repellent layer was measured after felt abrasion of 1,000 times reciprocation. The smaller the decrease in the water contact angle after abrasion, the smaller the decrease in performance by abrasion, and the more excellent the abrasion resistance.

[Materials]

(Compound (X-1))

Compound (X-1) having a number average molecular weight of 2,900 was obtained in accordance with Example 6 in WO2013/121984.

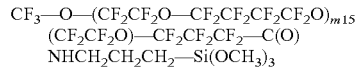

$$CF_3\text{—}O\text{—}(CF_2CF_2O\text{—}CF_2CF_2CF_2CF_2O)_{m15}$$
$$(CF_2CF_2O)\text{—}CF_2CF_2CF_2\text{—}C(O)$$
$$NHCH_2CH_2CH_2\text{—}Si(OCH_3)_3 \quad (X\text{-}1)$$

Average number of units m15: 7

[Ex. 1]

Into 20 g of a 5 mass % aqueous sodium silicate solution (sodium silicate solution No. 3 manufactured by SHOWA CHEMICAL), 12 g of a cation exchange resin (SK1B manufactured by Mitsubishi Chemical Corporation) was added, followed by stirring for 10 minutes. The cation exchange resin was removed by filtration to obtain an aqueous silicic acid solution. 0.25 g of the silicic acid solution was added to 4.75 g of isopropyl alcohol to obtain coating fluid 1 for forming silicon oxide layer (solid content concentration (as calculated as $SiO_2$): 0.25 mass %.

The coating fluid 1 for forming silicon oxide layer was subjected to the following measurements and as a result, it was confirmed that a silicon oxide powder containing, to Si, 300 ppm of sodium. 0 ppm of lithium, 0 ppm of potassium, 0 ppm of rubidium and 0 ppm of cesium could be obtained.

(Measurement Method)

The coating fluid 1 for forming silicon oxide layer was dried at 150° C. to remove the organic solvent and water to obtain a silicon oxide powder. The contents of sodium, lithium, potassium, rubidium and cesium to Si contained in the silicon oxide powder were measured by ICP optical emission spectrometer (SPS5520 manufactured by Hitachi High-Tech Science Corporation).

One surface of a glass substrate (Dragontrail (registered trademark) manufactured by Asahi Glass Company, Limited) was subjected to corona discharge treatment by a high frequency power source (CG102A manufactured by KASUGA DENKI, Inc.) at 80V at 3.5 Å.

To the treated surface of the glass substrate by the corona discharge treatment, the coating fluid 1 for forming silicon oxide layer was applied by a spin coating method at a number of revolutions of 3,000 rpm for a rotation time of 20 seconds to form a wet film. The wet film was fired at a firing temperature of 550° C. for a firing time of 30 minutes to produce a silicon oxide layer-provided glass substrate having a silicon oxide layer with a thickness of about 10 nm.

By TOF-SIMS, the average sodium concentration in a region with a depth from a surface in contact with the water/oil repellent layer of at least 0.1 nm and at most 0.3 nm in the obtained silicon oxide layer was obtained. The results are shown in FIGS. 2 and 3 and Table 1. The sodium concentration at a depth up to 10 nm was obtained by TOF-SIMS.

0.5 g of compound (X-1) as a deposition source was disposed in a molybdenum boat in a vacuum deposition apparatus (VTR-350M manufactured by ULVAC KIKO Inc.). The silicon oxide layer-provided glass substrate was disposed in the vacuum deposition apparatus, and the vacuum deposition apparatus was evacuated of air until the pressure became at most $5 \times 10^{-3}$ Pa. The boat was heated to 300° C., and the compound (X-1) was vacuum-deposited on the silicon oxide layer to form a deposited film having a thickness of 10 nm.

The glass substrate having the deposited film formed thereon was left to stand overnight at a temperature of 25° C. under a humidity of 40% to form a water/oil repellent layer having a thickness of 10 nm.

With respect to the water/oil repellent layer, the initial water contact angle and the abrasion resistance were evaluated. The results are shown in Table 1.

[Ex. 2]

A silicon oxide layer and a water/oil repellent layer were formed in the same manner as in Ex. 1 except that the firing temperature at the time of forming the silicon oxide layer was changed to 250° C.

By TOF-SIMS, the average sodium concentration in a region with a depth from a surface in contact with the water/oil repellent layer of at least 0.1 nm and at most 0.3 nm in the obtained silicon oxide layer was obtained. The results are shown in FIGS. 2 and 3 and Table 1.

With respect to the water/oil repellent layer, the initial water contact angle and the abrasion resistance were evaluated. The results are shown in Table 1.

[Ex. 3]

In the same manner as in Ex. 1, one surface of a glass substrate was subjected to corona discharge treatment.

Silicon oxide ($SiO_2$(C)) manufactured by Canon Optron Inc., sodium content to Si measured was less than 1 ppm) as a deposition source was disposed in a molybdenum boat in a vacuum deposition apparatus (VTR-350M manufactured by ULVAC KIKO Inc.). The glass substrate was disposed in the vacuum deposition apparatus, and the vacuum deposition apparatus of evaluated of air until the pressure became at most $5 \times 10^{-3}$ Pa. The boat was heated to 1,000° C., and to the treated surface of the glass substrate by the corona discharge treatment, silicon oxide was vacuum-deposited to form a silicon oxide layer having a thickness of 10 nm.

By TOF-SIMS, the average sodium concentration in a region with a depth from the surface in contact with the water/oil repellent layer of at least 0.1 nm and at most 0.3 nm in the obtained silicon oxide layer was obtained. The results are shown in FIGS. 2 and 3 and Table 1.

A water/oil repellent layer was formed in the same manner as in Ex. 1 except that the silicon oxide layer-provided glass substrate in Ex. 3 was used.

With respect to the water/oil repellent layer, the initial water contact angle and the abrasion resistance were evaluated. The results are shown in Table 1.

[Ex. 4]

To 20 g of a 5 mass % aqueous sodium silicate solution (sodium silicate solution No. 3 manufactured by SHOWA CHEMICAL), 4 g of a cation exchange resin (SK1B manufactured by Mitsubishi Chemical Corporation) was added, followed by stirring for 10 minutes. The cation exchange resin was removed by filtration to obtain an aqueous silicic acid solution. 1 g of the aqueous silicic acid solution was added to 4 g of isopropyl alcohol to obtain coating fluid 2 for forming silicon oxide layer (solid content concentration (as calculated as $SiO_2$): 1 mass %). With respect to the coating fluid 2 for forming silicon oxide layer, the content of sodium to Si in the obtained silicon oxide powder was measured and found to be 500 ppm. Further, the lithium content was 0 ppm, the potassium content was 0 ppm, the rubidium content was 0 ppm and the cesium content was 0 ppm.

A water/oil repellent layer was formed in the same manner as in Ex. 2 except that the coating fluid 1 for forming silicon oxide layer was changed to the coating fluid 2 for forming silicon oxide layer.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 1.

[Ex. 5]

The coating fluid 2 for forming silicon oxide layer obtained in Ex. 4 was dried at 150° C. and then formed by hydrostatic pressing (one minute under 180 MPa) to obtain formed product 1. With respect to the formed product 1, the sodium content was measured by ICP optical emission spectrometer (SPS5520 manufactured by Hitachi High-Tech Science Corporation) and found to be 500 ppm. Further, the lithium content was 0 ppm, the potassium content was 0 ppm, the rubidium content was 0 ppm, and the cesium content was 0 ppm.

A silicon oxide layer and a water/oil repellent layer were formed in the same manner as in Ex. 3 except that the deposition source was changed to the formed product 1.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 1.

[Ex. 6]

A silicon oxide layer having a thickness of 10 nm was formed in the same manner as in Ex. 5, and further fired at a firing temperature of 250° C. for a firing time of 30 minutes. Then, a water/oil repellent layer was formed in the same manner as in Ex. 1.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 1.

[Ex. 7]

M.S.GEL-D-100-60A (tradename, manufactured by AGC Si-Tech Co., Ltd., spherical porous silica gel having an average particle size of from 50 to 300 μm, hereinafter referred to as "MS gel") was formed by hydrostatic pressing (one minute under 180 MPa) to obtain formed product 2. A silicon oxide layer and a water/oil repellent layer were formed in the same manner as in Ex. 5 except that the formed product 2 was used instead of the formed product 1. Further, with respect to MS gel, the sodium content to Si was measured by ICP optical emission spectrometer (SPS5520 manufactured by Hitachi High-Tech Science Corporation) and found to be 23 ppm. Further, the lithium content was 0 ppm, the potassium content was 0 ppm, the rubidium content was 0 ppm, and the cesium content was 0 ppm.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 1.

[Ex. 8]

A silicon oxide layer having a thickness of 10 nm was formed in the same manner as in Ex. 7 and further fired at a firing temperature of 250° C. for firing time of 30 minutes. Then, a water/oil repellent layer was formed in the same manner as in Ex. 1.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 1.

TABLE 1

| Ex. | Silicon oxide layer Average Na concentration in region with depth 0.1 to 0.3 nm [atoms/cm$^3$] | Water contact angle of water/oil repellent layer Initial [degree] | Number of abrasion with steel wool 2,000 | Number of abrasion with steel wool 4,000 |
|---|---|---|---|---|
| 1 | 2.80 × 10$^{20}$ | 113.4 | ○ | ○ |
| 2 | 2.13 × 10$^{20}$ | 113.1 | ○ | ○ |
| 3 | 1.02 × 10$^{19}$ | 111.8 | X | — |
| 4 | 2.60 × 10$^{20}$ | 114.6 | ○ | ○ |
| 5 | 2.45 × 10$^{20}$ | 113.2 | ○ | ○ |
| 6 | 2.56 × 10$^{20}$ | 113.5 | ○ | ○ |
| 7 | 5.05 × 10$^{19}$ | 112.9 | ○ | ○ |
| 8 | 7.34 × 10$^{19}$ | 113 | ○ | ○ |

In Ex. 1, 2 and 4, the silicon oxide layer is a layer containing a condensate of silicic acid, and Ex. 5 to 8, it is a layer formed by deposition of sodium-containing silicon oxide. Further, in Ex. 1, 2 and 4 to 8, in the silicon oxide layer, the average sodium concentration in a region with a depth from the surface in contact with the water/oil repellent layer of at least 0.1 nm and at most 0.3 nm was at least 2.0×10$^{19}$ atoms/cm$^3$, whereby the water/oil repellent layer was excellent in abrasion resistance.

By comparison between Ex. 2 and 4, the initial water contact angle is higher in Ex. 4. This is considered to be because the sodium content to Si in the silicon oxide powder formed from the coating fluid 2 for forming silicon oxide layer in Ex. 4 was higher than the sodium content to Si in the silicon oxide powder formed from the coating fluid 1 for forming silicon oxide layer in Ex. 2, whereby the surface polarity of the silicon oxide layer is higher in Ex. 4, and molecules of the fluorinated compound having a hydrolyzable silyl group deposited on the silicon oxide layer are more highly oriented.

In Ex. 3, the silicon oxide layer was a deposited film of silicon oxide, and in the silicon oxide layer, the average sodium concentration in a region with a depth from the surface in contact with the water/oil repellent layer of at least 0.1 nm and at most 0.3 nm was less than 2.0×10$^{19}$ atoms/cm$^3$, and thus the water/oil repellent layer was inferior in the abrasion resistance.

[Ex. 9]

A silicon oxide layer and a water/oil repellent layer were formed in the same manner as in Ex. 1 except that a sapphire substrate (manufactured by Namiki Precision Jewel Co., Ltd., diameter 76.2 mm) not subjected to corona discharge treatment was used instead of the glass substrate.

By TOF-SIMS, the average sodium concentration in a region with a depth from the surface in contact with the water/oil repellent layer of at least 0.1 nm and at most 0.3 nm in the obtained silicon oxide layer was obtained. Further, with respect to the water/oil repellent layer, the initial water contact angle and the abrasion resistance were evaluated. The results are shown in Table 2.

[Ex. 10]

A silicon oxide layer and a water/oil repellent layer were formed in the same manner as in Ex. 1 except that a sapphire substrate (manufactured by Namiki Precision Jewel Co., Ltd., diameter: 76.2 mm) having one surface subjected to corona discharge treatment using a high frequency power source (HV2010 manufactured by TANTEC) at 28 kV at 1,000 W at a treatment rate of 1 mm/sec was used instead of the glass substrate. The silicon oxide layer was vacuum-deposited on the treated surface of the sapphire substrate by the corona discharge treatment.

By TOF-SIMS, the average sodium concentration in a region with a depth from the surface in contact with the water/oil repellent layer of at least 0.1 nm and at most 0.3 nm in the obtained silicon oxide layer was obtained. Further, with respect to the water/oil repellent layer, the initial water contact angle and the abrasion resistance were evaluated. The results are shown in Table 2.

[Ex. 11]

A silicon oxide layer and a water/oil repellent layer were formed in the same manner as in Ex. 3 except that a sapphire substrate (manufactured by Namiki Precision Jewel Co., Ltd., diameter: 76.2 mm) not subjected to corona discharge treatment was used instead of the glass substrate.

By TOF-SIMS, the average sodium concentration in a region with a depth from the surface in contact with the water/oil repellent layer of at least 0.1 nm and at most 0.3 nm in the obtained silicon oxide layer was obtained. Further, with respect to the water/oil repellent layer, the initial water contact angle and the abrasion resistance were evaluated. The results are shown in Table 2.

TABLE 2

| | Silicon oxide layer Average Na concentration in region with depth | Water contact angle of water/oil repellent layer [degree] | |
|---|---|---|---|
| Ex. | 0.1 to 0.3 nm [atoms/cm$^3$] | Initial | Number of abrasion with felt 1,000 |
| 9 | 1.86 × 10$^{20}$ | 109.9 | 94.5 |
| 10 | 2.89 × 10$^{20}$ | 109.9 | 109.9 |
| 11 | 1.02 × 10$^{19}$ | 111.2 | 86.5 |

In Ex. 9 and 10, the silicon oxide layer is a layer containing a condensate of silicic acid, and in the silicon oxide layer, the average sodium concentration in a region with a depth from the surface in contact with the water/oil repellent layer of at least 0.1 nm and at most 0.3 nm was at least 2.0×10$^{19}$ atoms/cm$^3$, whereby the water/oil repellent layer was excellent in abrasion resistance.

In Ex. 11, the silicon oxide layer was a deposited film, and in the silicon oxide layer, the average sodium concentration in a region with a depth from the surface in contact with the water/oil repellent layer of at least 0.1 nm and at most 0.3 nm was less than 2.0×10$^{19}$ atoms/cm$^3$, and thus the water/oil repellent layer was inferior in the abrasion resistance.

[Ex. 12]

2.2 g of sodium hydroxide (manufactured by JUNSEI CHEMICAL CO., LTD.) was dissolved in 24 g of distilled water to obtain a 8.4 mass % aqueous sodium hydroxide solution. 24 g of the 8.4 mass % aqueous sodium hydroxide solution and 20 g of MS gel were mixed so that the aqueous sodium hydroxide solution was absorbed in the MS gel. The MS gel which had absorbed the aqueous sodium hydroxide solution was dried at 25° C. for 8 hours and formed by hydrostatic pressing (2 seconds under 50 MPa) and fired at 1,000° C. for one hour to obtain formed product 3 (pellets). With respect to the formed product 3, the sodium content to Si was measured by ICP optical emission spectrometer (SPS5520 manufactured by Hitachi High-Tech Science Corporation). The results are shown in Table 3. Further, the lithium content was 0 ppm, the potassium content was 0 ppm, the rubidium content was 0 ppm, and the cesium content was 0 ppm.

A silicon oxide layer and a water/oil repellent layer were formed in the same manner as in Ex. 3 except that the deposition source was changed to the formed product 3.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 3.

[Ex. 13 to 31]

A formed product (pellets) was obtained in the same manner as in Ex. 12 except that the conditions for producing the formed product were changed as identified in Table 3. With respect to each formed product, the sodium content to Si was measured by ICP optical emission spectrometer (SPS5520 manufactured by Hitachi High-Tech Science Corporation). The results are shown in Table 3. Further, each formed product had a lithium content of 0 ppm, a potassium content of 0 ppm, a rubidium content of 0 ppm and a cesium content of 0 ppm.

A silicon oxide layer and a water/oil repellent layer were formed in the same manner as in Ex. 3 except that the deposition source was changed to each formed product.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 3.

TABLE 3

| | | Formed product production conditions | | | | | |
|---|---|---|---|---|---|---|---|
| | | Na-containing aqueous solution | | Drying | Pressing | Pressing | Firing | Na content to Si in formed |
| Ex. | Silicon dioxide | Type | Concentration [mass %] | temperature [° C.] | pressure [MPa] | time [sec] | temperature [° C.] | product [ppm] |
| 12 | MS gel | NaOH | 8.4 | 25 | 50 | 2 | 1,000 | 60,000 |
| 13 | ↑ | NaOH | 11.2 | 25 | 50 | 2 | 1,000 | 80,000 |
| 14 | ↑ | NaOH | 14 | 25 | 50 | 2 | 1,000 | 100,000 |
| 15 | ↑ | NaOH | 21 | 25 | 50 | 2 | 1,000 | 150,000 |
| 16 | ↑ | NaOH | 5.6 | 25 | 50 | 2 | 1,000 | 40,000 |
| 17 | ↑ | NaOH | 2.8 | 25 | 50 | 2 | 1,000 | 20,000 |
| 18 | ↑ | NaOH | 1.4 | 25 | 50 | 2 | 1,000 | 10,000 |
| 19 | ↑ | NaOH | 0.7 | 25 | 50 | 2 | 1,000 | 5,000 |
| 20 | ↑ | NaOH | 0.14 | 25 | 50 | 2 | 1,000 | 1,000 |
| 21 | ↑ | NaOH | 0.07 | 25 | 50 | 2 | 1,000 | 500 |
| 22 | ↑ | NaOH | 8.4 | 25 | 50 | 2 | 600 | 60,000 |
| 23 | ↑ | NaOH | 8.4 | 25 | 50 | 2 | 200 | 60,000 |
| 24 | ↑ | NaOH | 8.4 | 25 | 50 | 2 | 25 | 60,000 |
| 25 | ↑ | NaOH | 8.4 | 25 | 5 | 2 | 1,000 | 60,000 |
| 26 | ↑ | NaOH | 8.4 | 200 | 50 | 60 | 1,000 | 60,000 |
| 27 | ↑ | NaOH | 8.4 | 1,000 | 50 | 60 | 1,000 | 60,000 |
| 28 | ↑ | Na$_2$CO$_3$ | 8.4 | 1,200 | 50 | 60 | 1,000 | 60,000 |
| 29 | Silica gel | NaOH | 8.4 | 25 | 50 | 60 | 1,000 | 60,000 |
| 30 | Molten silica powder | NaOH | 8.4 | 25 | 50 | 60 | 1,000 | 60,000 |
| 31 | MS gel | NaOH | 0.014 | 25 | 50 | 2 | 1,000 | 100 |

TABLE 3-continued

| | Silicon oxide layer | | Water contact angle of water/oil repellent layer | | | |
|---|---|---|---|---|---|---|
| | Average Na concentration in region with depth | | Initial | Number of abrasion with steel wool | | |
| Ex. | 0.1 to 0.3 nm [atoms/cm$^3$] | Surface roughness [nm] | [degree] | 2,000 | 4,000 | 6,000 |
| 12 | $3.10 \times 10^{21}$ | 3.7 | 113 | ○ | ○ | ○ |
| 13 | $4.10 \times 10^{21}$ | 6.3 | 112 | ○ | ○ | ○ |
| 14 | $4.90 \times 10^{21}$ | 6.9 | 114 | ○ | ○ | ○ |
| 15 | $8.20 \times 10^{21}$ | 7.2 | 114 | ○ | ○ | ○ |
| 16 | $1.60 \times 10^{21}$ | 1.5 | 113 | ○ | ○ | ○ |
| 17 | $9.60 \times 10^{20}$ | 0.9 | 113 | ○ | ○ | ○ |
| 18 | $5.40 \times 10^{20}$ | 0.3 | 112 | ○ | ○ | x |
| 19 | $2.60 \times 10^{20}$ | 0.2 | 114 | ○ | ○ | x |
| 20 | $5.60 \times 10^{18}$ | 0.2 | 113 | ○ | ○ | x |
| 21 | $2.70 \times 10^{19}$ | 0.2 | 113 | ○ | ○ | x |
| 22 | $2.00 \times 10^{21}$ | 2.5 | 114 | ○ | ○ | ○ |
| 23 | $2.20 \times 10^{21}$ | 3.8 | 113 | ○ | ○ | ○ |
| 24 | $2.00 \times 10^{21}$ | 4.1 | 114 | ○ | ○ | ○ |
| 25 | $2.30 \times 10^{21}$ | 3.3 | 112 | ○ | ○ | ○ |
| 26 | $2.10 \times 10^{21}$ | 3.1 | 114 | ○ | ○ | ○ |
| 27 | $2.20 \times 10^{21}$ | 3 | 114 | ○ | ○ | ○ |
| 28 | $2.20 \times 10^{21}$ | 2.8 | 113 | ○ | ○ | ○ |
| 29 | $2.00 \times 10^{21}$ | 3.7 | 113 | ○ | ○ | ○ |
| 30 | $1.90 \times 10^{21}$ | 2.9 | 114 | ○ | ○ | ○ |
| 31 | $4.90 \times 10^{18}$ | 0.2 | 113 | ○ | x | x |

In Table 3, silica gel is FUJI SILICA GEL A (tradename, manufactured by FUJI SILYSIA CHEMICAL LTD.), molten silica powder is AEROSIL 200 (tradename, manufactured by NIPPON AEROSIL CO., LTD.), NaOH is sodium hydroxide (manufactured by JUNSEI CHEMICAL CO., LTD.), and $Na_2CO_3$ is sodium carbonate (manufactured by JUNSEI CHEMICAL CO., LTD.).

In Ex. 12 to 30, the silicon oxide layer was a deposited film, and in the silicon oxide layer, the average sodium concentration in a region with a depth from the surface in contact with the water/oil repellent layer of at least 0.1 nm and at most 0.3 nm in the silicon oxide layer was at least $2.0 \times 10^{19}$ atoms/cm$^3$, whereby the water/oil repellent layer was excellent in abrasion resistance.

In Ex. 31, the silicon oxide layer was a deposited film, and in the silicon oxide layer, the average sodium concentration in a region with a depth from the surface in contact with the water/oil repellent layer of at least 0.1 nm and at most 0.3 nm in the silicon oxide layer was less than $2.0 \times 10^{19}$ atoms/cm$^3$, and thus the water/oil repellent layer was inferior in abrasion resistance.

[Ex. 32 to 43]

A formed product (pellets) was obtained in the same manner as in Ex. 12 except that the conditions for producing the formed product were changed as identified in Table 4. As silicon dioxide, MS gel was used in each Ex. With respect to each formed product, the alkali content to Si was measured by ICP optical emission spectrometer (SPS5520 manufactured by Hitachi High-Tech Science Corporation). The results are shown in Table 4.

A silicon oxide layer and a water/oil repellent layer were formed in the same manner as in Ex. 3 except that the deposition source was changed to each formed product.

The average sodium concentration in a region with a depth from the surface in contact with the water/oil repellent layer of at least 0.1 nm and at most 0.3 nm in the silicon oxide layer was obtained. Further, with respect to the water/oil repellent layer, the initial water contact angle and the abrasion resistance were evaluated. The results are shown in Table 4.

TABLE 4

| | Formed product production conditions | | | | | | |
|---|---|---|---|---|---|---|---|
| | Alkali metal source-containing aqueous solution | | Drying | Pressing | Pressing | Firing | Alkali metal content to Si |
| Ex. | Type | Concentration [mass %] | temperature [° C.] | pressure [MPa] | time [sec] | temperature [° C.] | in formed product [ppm] |
| 32 | LiOH | 5.6 | 25 | 50 | 2 | 1,000 | 32,000 |
| 33 | $Li_2CO_3$ | 5.6 | 25 | 50 | 2 | 1,000 | 33,000 |
| 34 | KOH | 5.6 | 25 | 50 | 2 | 1,000 | 38,000 |
| 35 | $K_2CO_3$ | 5.6 | 25 | 50 | 2 | 1,000 | 37,000 |
| 36 | RbOH | 5.6 | 25 | 50 | 2 | 1,000 | 39,000 |
| 37 | $Rb_2CO_3$ | 5.6 | 25 | 50 | 2 | 1,000 | 38,000 |
| 38 | CsOH | 5.6 | 25 | 50 | 2 | 1,000 | 40,000 |
| 39 | $Cs_2CO_3$ | 5.6 | 25 | 50 | 2 | 1,000 | 39,000 |
| 40 | NaOH + LiOH (molar ratio 1:1) | 5.6 | 25 | 50 | 2 | 1,000 | 34,000 |
| 41 | $Na_2CO_3$ + $Li_2CO_3$ (molar ratio 1:1) | 5.6 | 25 | 50 | 2 | 1,000 | 33,000 |

TABLE 4-continued

| Ex. | | | | | | | |
|---|---|---|---|---|---|---|---|
| 42 | NaOH + KOH (molar ratio 1:1) | 5.6 | 25 | 50 | 2 | 1,000 | 37,000 |
| 43 | NaOH + LiOH + KOH (molar ratio 1:1:1) | 5.6 | 25 | 50 | 2 | 1,000 | 36,000 |

| | Silicon oxide layer | | Water contact angle of water/oil repellent layer | | | |
|---|---|---|---|---|---|---|
| | Average alkali metal concentration in region with depth 0.1 to 0.3 nm | Surface roughness | Initial | Number of abrasion with steel wool | | |
| Ex. | [atoms/cm$^3$] | [nm] | [degree] | 2,000 | 4,000 | 6,000 |
| 32 | $1.50 \times 10^{21}$ | 1.2 | 113 | ○ | ○ | ○ |
| 33 | $1.50 \times 10^{21}$ | 1.3 | 112 | ○ | ○ | ○ |
| 34 | $1.70 \times 10^{21}$ | 1.4 | 114 | ○ | ○ | ○ |
| 35 | $1.60 \times 10^{21}$ | 1.5 | 114 | ○ | ○ | ○ |
| 36 | $1.70 \times 10^{21}$ | 1.9 | 113 | ○ | ○ | ○ |
| 37 | $1.70 \times 10^{20}$ | 1.4 | 113 | ○ | ○ | ○ |
| 38 | $1.80 \times 10^{20}$ | 2 | 112 | ○ | ○ | ○ |
| 39 | $1.70 \times 10^{20}$ | 1.8 | 114 | ○ | ○ | ○ |
| 40 | $1.50 \times 10^{21}$ | 1.2 | 113 | ○ | ○ | ○ |
| 41 | $1.50 \times 10^{21}$ | 1.4 | 113 | ○ | ○ | ○ |
| 42 | $1.60 \times 10^{21}$ | 1.4 | 114 | ○ | ○ | ○ |
| 43 | $1.60 \times 10^{21}$ | 1.5 | 113 | ○ | ○ | ○ |

In Table 4, NaOH is sodium hydroxide (manufactured by JUNSEI CHEMICAL CO., LTD.), Na$_2$CO$_3$ is sodium carbonate (manufactured by JUNSEI CHEMICAL CO., LTD.), LiOH is lithium hydroxide (manufactured by JUNSEI CHEMICAL CO., LTD.), Li$_2$CO$_3$ is lithium carbonate (manufactured by JUNSEI CHEMICAL CO., LTD.), KOH is potassium hydroxide (manufactured by JUNSEI CHEMICAL CO., LTD.), K$_2$CO$_3$ is potassium carbonate (manufactured by JUNSEI CHEMICAL CO., LTD.), RbOH is rubidium hydroxide (manufactured by JUNSEI CHEMICAL CO., LTD.), Rb$_2$CO$_3$ is rubidium carbonate (manufactured by JUNSEI CHEMICAL CO., LTD.), CsOH is cesium hydroxide (manufactured by JUNSEI CHEMICAL CO., LTD.), and Cs$_2$CO$_3$ is cesium carbonate (manufactured by JUNSEI CHEMICAL CO., LTD.).

In Ex. 32 to 43, the silicon oxide layer was a deposited film, and in the silicon oxide layer, the average concentration of the total alkali metal atoms in a region with a depth from the surface in contact with the water/oil repellent layer of at least 0.1 nm and at most 0.3 nm in the silicon oxide layer was at least $2.0 \times 10^{19}$ atoms/cm$^3$, whereby the water/oil repellent layer was excellent in abrasion resistance.

INDUSTRIAL APPLICABILITY

The water/oil repellent layer-provided article of the present invention is useful as an optical article, a touch panel (e.g. a surface which can be touched by a finger), an antireflection film, SiO$_2$-treated glass, tempered glass, a sapphire substrate, a quartz substrate or a metal mold.

This application is a continuation of PCT Application No. PCT/JP2018/023150, filed on Jun. 18, 2018, which is based upon and claims the benefit of priority from Japanese Patent Application No. 2017-121642 filed on Jun. 21, 2017 and Japanese Patent Application No. 2018-004491 filed on Jan. 15, 2018. The contents of those applications are incorporated herein by reference in their entireties.

REFERENCE SYMBOLS

10: Water/oil repellent layer-provided article, 12: substrate, 14: silicon oxide layer, 16: water/oil repellent layer.

The invention claimed is:

1. An article, comprising:
a substrate,
a water/oil repellent layer comprising a hydrolyzed condensate of a fluorinated compound having a hydrolyzed silyl group, and
a silicon oxide layer comprising alkali metal atoms, present between the substrate and the water/oil repellent layer,
wherein the silicon oxide layer has a surface in contact with the water/oil repellent layer,
wherein in the silicon oxide layer, an average concentration of the alkali metal atoms in a region with a depth from the surface in contact with the water/oil repellent layer of from 0.1 to 0.3 nm, is from $2.7 \times 10^{19}$ atoms/cm$^3$ to $8.2 \times 10^{21}$ atoms/cm$^3$, and
wherein the fluorinated compound is a compound having the hydrolyzed silyl group and a poly(oxyperfluoroalkylene) chain.

2. The article according to claim 1, wherein at least part of the alkali metal atoms are sodium atoms.

3. The article according to claim 1, wherein silicon oxide in the silicon oxide layer comprises a condensate of silicic acid or a hydrolyzed condensate of an alkoxysilane.

4. The article according to claim 1, wherein silicon oxide in the silicon oxide layer comprises a deposit of silicon oxide comprising the alkali metal atoms.

5. The article according to claim 1, wherein
at least part of the alkali metal atoms are sodium atoms, and
silicon oxide in the silicon oxide layer comprises a condensate of silicic acid or a hydrolyzed condensate of an alkoxysilane.

6. A method for producing an article according to claim 1, the method comprising:
forming a silicon oxide layer comprising the alkali metal atoms on a surface of the substrate using a silicon oxide-forming material comprising a silicon oxide precursor and an alkali metal source, and
the forming, on the surface of the silicon oxide layer, a water/oil repellent layer comprising hydrolyzed condensate of a fluorinated compound having a hydrolyzed silyl group, wherein the silicon oxide layer is a silicon oxide layer in which an average concentration of the alkali metal atoms in a region with a depth from the surface in contact with the water/oil repellent layer of from 0.1 to 0.3 nm is from $2.7 \times 10^{19}$ atoms/cm$^3$ to $8.2 \times 10^{21}$ atoms/cm$^3$, and wherein the fluorinated compound is a compound having the hydrolyzed silyl group and a poly(oxyperfluoroalkylene) chain.

7. The production method according to claim 6, wherein the silicon oxide layer is formed on the substrate surface using a coating fluid comprising at least one silicon oxide precursor selected from the group consisting of silicic acid, a partial condensate of silicic acid, a tetraalkoxysilane or its partial condensate, an alkali metal source and a solvent.

8. The production method according to claim 6, wherein the silicon oxide-forming material is the silicon oxide comprising the alkali metal source of alkali metal atoms.

9. The production method according to claim 8, wherein the method of forming the silicon oxide layer is a deposition method.

10. The production method according to claim 6, wherein at least part of the alkali metal atoms are sodium atoms.

11. The production method according to claim 6, wherein the surface of the substrate is treated by corona discharge treatment, plasma treatment or plasma graft polymerization treatment, and then on the treated substrate surface, the silicon oxide layer is formed.

* * * * *